(12) United States Patent
Shi et al.

(10) Patent No.: US 9,170,421 B2
(45) Date of Patent: Oct. 27, 2015

(54) DISPLAY APPARATUS INCORPORATING MULTI-LEVEL SHUTTERS

(71) Applicant: Pixtronix, Inc., San Diego, CA (US)

(72) Inventors: Jianru Shi, Haverhill, MA (US);
Richard S. Payne, Andover, MA (US);
Timothy J. Brosnihan, Haverhill, MA (US); Eugene Fike, Natick, MA (US);
Edward Buckley, Amesbury, MA (US);
Javier Villarreal, Somerville, MA (US)

(73) Assignee: Pixtronix, Inc., San Diego, CA (US)

( * ) Notice: Subject to any disclaimer, the term of this patent is extended or adjusted under 35 U.S.C. 154(b) by 324 days.

(21) Appl. No.: 13/759,769

(22) Filed: Feb. 5, 2013

(65) Prior Publication Data
US 2014/0218374 A1    Aug. 7, 2014

(51) Int. Cl.
*G06F 15/00* (2006.01)
*G09G 3/34* (2006.01)
*G02B 26/02* (2006.01)
*B81B 3/00* (2006.01)

(52) U.S. Cl.
CPC . *G02B 26/02* (2013.01); *B81B 3/00* (2013.01); *G02B 26/023* (2013.01)

(58) Field of Classification Search
CPC combination set(s) only.
See application file for complete search history.

(56) References Cited

U.S. PATENT DOCUMENTS

| | | |
|---|---|---|
| 4,564,836 A | 1/1986 | Vuilleumier et al. |
| 4,709,988 A | 12/1987 | Kai et al. |
| 4,728,936 A | 3/1988 | Guscott et al. |
| 5,044,734 A | 9/1991 | Sperl et al. |
| 5,062,689 A | 11/1991 | Koehler |
| 5,096,279 A | 3/1992 | Hornbeck et al. |
| 5,142,405 A | 8/1992 | Hornbeck |
| 5,233,459 A | 8/1993 | Bozler et al. |
| 5,319,491 A | 6/1994 | Selbrede |
| 5,339,179 A | 8/1994 | Rudisill et al. |
| 5,450,230 A | 9/1995 | Masuda et al. |
| 5,517,347 A | 5/1996 | Sampsell |
| 5,691,695 A | 11/1997 | Lahiff |
| 5,745,281 A | 4/1998 | Yi et al. |

(Continued)

FOREIGN PATENT DOCUMENTS

| | | |
|---|---|---|
| EP | 0786679 A2 | 7/1997 |
| EP | 1091342 A2 | 4/2001 |

(Continued)

OTHER PUBLICATIONS

International Search Report and Written Opinion—PCT/US2014/014600—ISA/EPO—May 9, 2014.

(Continued)

*Primary Examiner* — Kee Tung
*Assistant Examiner* — Leon T Cain, II
(74) *Attorney, Agent, or Firm* — Edward A. Gordon; Foley & Lardner LLP

(57) ABSTRACT

This disclosure provides systems, methods and apparatus for providing multi-level multi-state shutter assemblies. The shutter assembly includes at least a first shutter at a first height over a substrate and a second shutter at a second height over the substrate. Both the first shutter and the second shutter can be operated in an open or closed state for passing or partially blocking light propagating through an aperture. In some implementations, the shutter assembly can operate in four states: a fully transmissive state, a fully obstructive state and two partially transmissive states based on the open or closed states of the first and second shutters.

16 Claims, 25 Drawing Sheets

(56) References Cited

U.S. PATENT DOCUMENTS

| | | |
|---|---|---|
| 5,781,331 A | 7/1998 | Carr et al. |
| 5,784,189 A | 7/1998 | Bozler et al. |
| 5,794,761 A | 8/1998 | Renaud et al. |
| 5,835,256 A | 11/1998 | Huibers |
| 5,986,796 A | 11/1999 | Miles |
| 6,031,656 A | 2/2000 | Little et al. |
| 6,034,807 A | 3/2000 | Little et al. |
| 6,046,840 A | 4/2000 | Huibers |
| 6,069,676 A | 5/2000 | Yuyama |
| 6,195,195 B1 | 2/2001 | Chethik |
| 6,201,633 B1 | 3/2001 | Peeters et al. |
| 6,288,824 B1 | 9/2001 | Kastalsky |
| 6,288,829 B1 | 9/2001 | Kimura |
| 6,300,154 B2 | 10/2001 | Clark et al. |
| 6,323,834 B1 | 11/2001 | Colgan et al. |
| 6,407,851 B1 | 6/2002 | Islam et al. |
| 6,411,423 B2 | 6/2002 | Ham |
| 6,514,111 B2 | 2/2003 | Ebihara et al. |
| 6,583,915 B1 | 6/2003 | Hong et al. |
| 6,600,474 B1 | 7/2003 | Heines et al. |
| 6,643,065 B1 | 11/2003 | Silberman |
| 6,650,455 B2 | 11/2003 | Miles |
| 6,671,078 B2 | 12/2003 | Flanders et al. |
| 6,674,562 B1 | 1/2004 | Miles |
| 6,680,792 B2 | 1/2004 | Miles |
| 6,701,039 B2 | 3/2004 | Bourgeois et al. |
| 6,775,048 B1 | 8/2004 | Starkweather et al. |
| 6,798,935 B2 | 9/2004 | Bourgeois et al. |
| 6,827,456 B2 | 12/2004 | Parker et al. |
| 6,912,082 B1 | 6/2005 | Lu et al. |
| 6,969,635 B2 | 11/2005 | Patel et al. |
| 7,050,219 B2 | 5/2006 | Kimura |
| 7,123,796 B2 | 10/2006 | Steckl et al. |
| 7,140,751 B2 | 11/2006 | Lin |
| 7,227,677 B2 | 6/2007 | Ravnkilde et al. |
| 7,271,945 B2 | 9/2007 | Hagood et al. |
| 7,274,416 B2 | 9/2007 | Feenstra et al. |
| 7,304,785 B2 | 12/2007 | Hagood et al. |
| 7,304,786 B2 | 12/2007 | Hagood et al. |
| 7,920,314 B2 | 4/2011 | Nerden |
| 8,233,114 B2 | 7/2012 | Mimura et al. |
| 2003/0128218 A1 | 7/2003 | Struyk |
| 2003/0156422 A1 | 8/2003 | Tatewaki et al. |
| 2003/0164814 A1 | 9/2003 | Starkweather et al. |
| 2004/0080484 A1 | 4/2004 | Heines et al. |
| 2004/0125062 A1 | 7/2004 | Yamamoto et al. |
| 2004/0136680 A1 | 7/2004 | Medina et al. |
| 2004/0196525 A1 | 10/2004 | Fujii et al. |
| 2005/0052681 A1 | 3/2005 | Kogi |
| 2005/0088404 A1 | 4/2005 | Heines et al. |
| 2005/0104804 A1 | 5/2005 | Feenstra et al. |
| 2005/0195468 A1 | 9/2005 | Sampsell |
| 2005/0225827 A1 | 10/2005 | Kastalsky |
| 2006/0187190 A1 | 8/2006 | Hagood et al. |
| 2006/0187191 A1 | 8/2006 | Hagood et al. |
| 2006/0187528 A1 | 8/2006 | Hagood et al. |
| 2006/0209000 A1 | 9/2006 | Sumiyoshi et al. |
| 2006/0209012 A1 | 9/2006 | Hagood, IV |
| 2006/0250325 A1 | 11/2006 | Hagood et al. |
| 2006/0250676 A1 | 11/2006 | Hagood, IV |
| 2006/0256039 A1 | 11/2006 | Hagood et al. |
| 2007/0002156 A1 | 1/2007 | Hagood, IV et al. |
| 2007/0086078 A1 | 4/2007 | Hagood et al. |
| 2007/0091038 A1 | 4/2007 | Hagood, IV et al. |
| 2007/0195026 A1 | 8/2007 | Hagood et al. |
| 2007/0205969 A1 | 9/2007 | Hagood, IV et al. |
| 2007/0216987 A1 | 9/2007 | Hagood et al. |
| 2007/0223080 A1 | 9/2007 | Hagood, IV et al. |
| 2007/0279347 A1* | 12/2007 | Muneyoshi et al. ............ 345/84 |
| 2007/0279727 A1 | 12/2007 | Gandhi et al. |
| 2008/0013145 A1 | 1/2008 | Chui et al. |
| 2008/0030827 A1 | 2/2008 | Hagood et al. |
| 2008/0049294 A1 | 2/2008 | Bartzke et al. |
| 2008/0062500 A1 | 3/2008 | Hagood, IV et al. |
| 2008/0158635 A1 | 7/2008 | Hagood et al. |
| 2008/0165122 A1 | 7/2008 | Duthaler et al. |
| 2010/0118373 A1 | 5/2010 | Kim |
| 2011/0043504 A1 | 2/2011 | Chang |
| 2011/0043882 A1 | 2/2011 | Yoon et al. |
| 2011/0090554 A1 | 4/2011 | Tung |
| 2011/0235147 A1 | 9/2011 | Lee et al. |
| 2012/0026205 A1* | 2/2012 | Yoon et al. .................... 345/690 |
| 2012/0154455 A1 | 6/2012 | Steyn et al. |
| 2012/0250138 A1* | 10/2012 | Yasui et al. .................... 359/296 |
| 2012/0280971 A1 | 11/2012 | Hagood et al. |
| 2013/0010341 A1 | 1/2013 | Hagood et al. |

FOREIGN PATENT DOCUMENTS

| | | |
|---|---|---|
| EP | 1734502 A1 | 12/2006 |
| JP | 2000214393 A | 8/2000 |
| JP | 2005221917 A | 8/2005 |
| JP | 2008275985 A | 11/2008 |
| JP | 2010197778 A | 9/2010 |
| JP | 2011209689 A | 10/2011 |
| TW | 201211975 A | 3/2012 |
| TW | 201235886 A | 9/2012 |
| WO | 2004104648 A1 | 12/2004 |
| WO | 2006017129 A2 | 2/2006 |

OTHER PUBLICATIONS

Ravnkilde J., et al., "Fabrication of Nickel Microshutter Arrays for Spatial Light Modulation", Mesomechanics, 2002, pp. 161-165. Also on their web site: http://www2.mic.dtu.dk/research/mems/publications/Papers/Dicon_Meso2002.pdf.

Wang K., et al., "Highly Space-Efficient Electrostatic Zigzag Transmissive Micro-Optic Switches for an Integrated MEMS Optical Display System", Transducers 03 Conference, Jun. 8-12, 2003, vol. 1, pp. 575-575.

Taiwan Search Report—TW103103827—TIPO—Nov. 10, 2014.

* cited by examiner

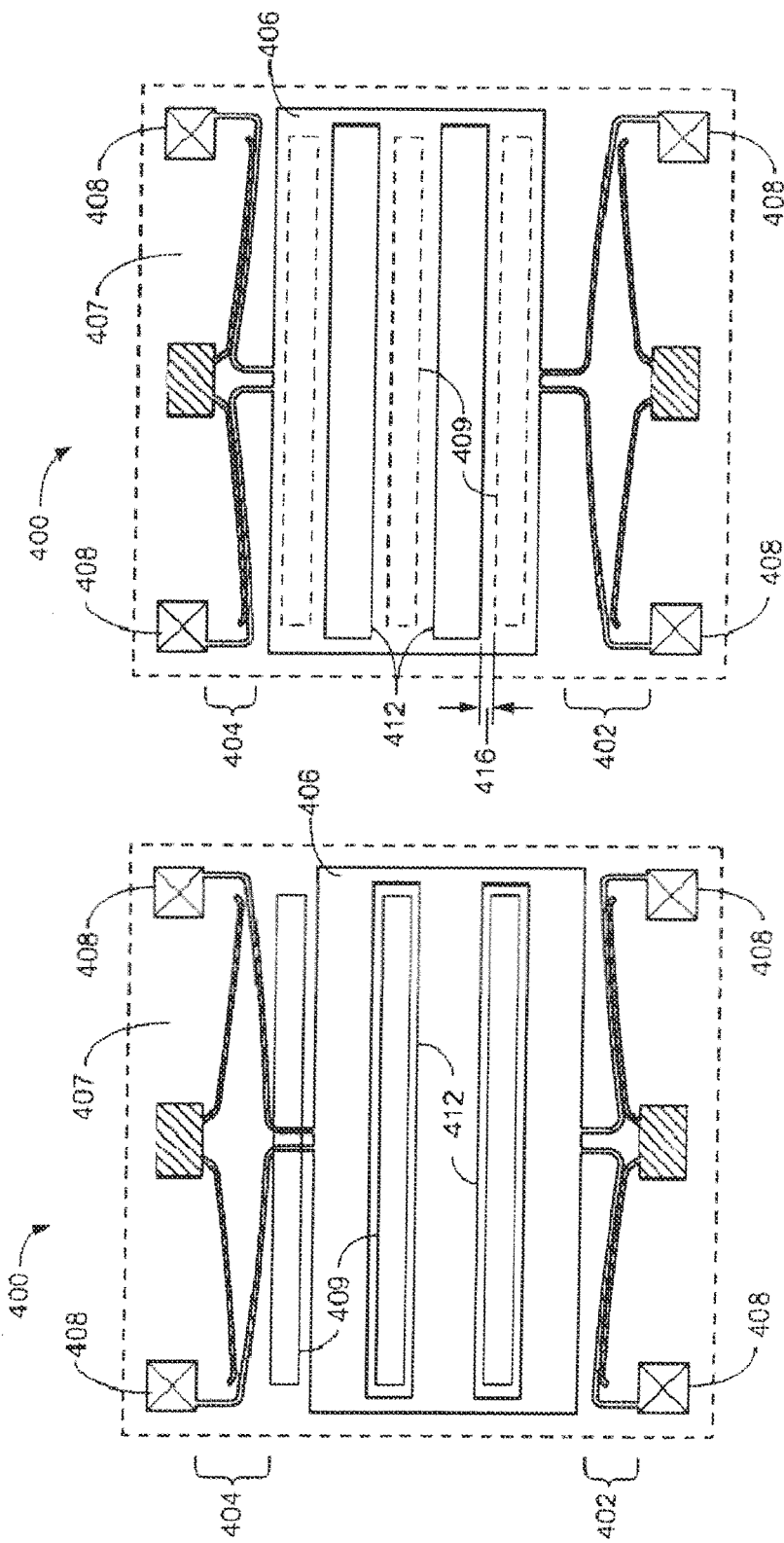

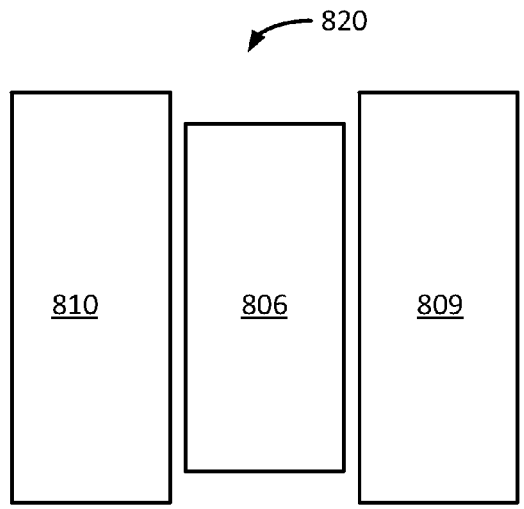 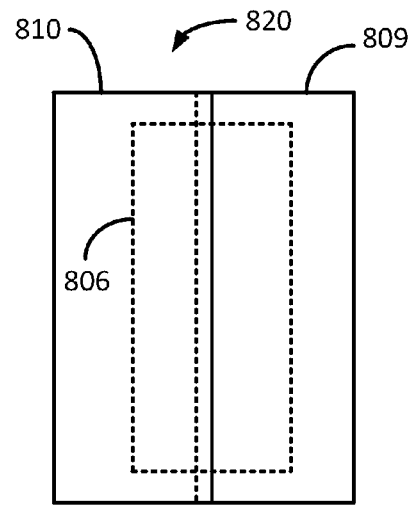
FIGURE 9A    FIGURE 9B
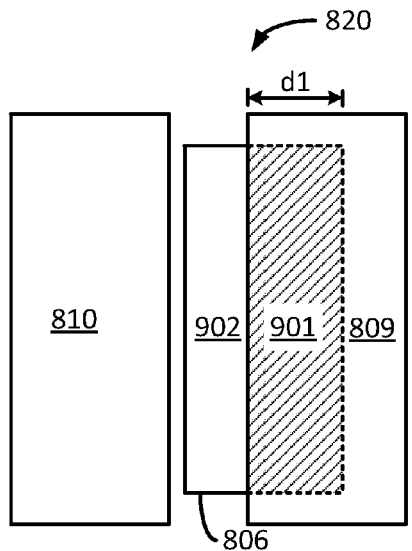 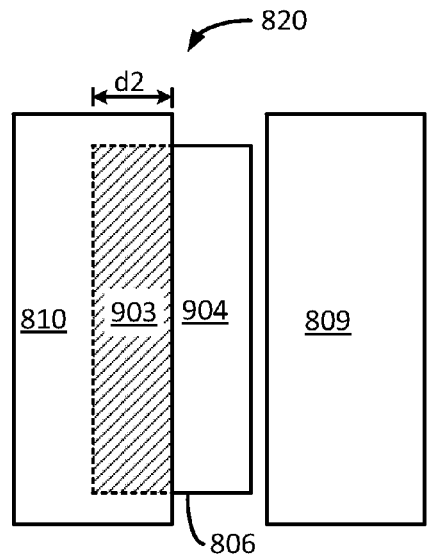
FIGURE 9C    FIGURE 9D

DISPLAY APPARATUS INCORPORATING MULTI-LEVEL SHUTTERS

TECHNICAL FIELD

This disclosure relates to the field of imaging displays, and in particular, to imaging displays employing multi-level shutters.

DESCRIPTION OF THE RELATED TECHNOLOGY

Some displays, such as direct view microelectromechanical systems (MEMS) displays, employ a plurality of light modulators in conjunction with light sources for displaying images. Each light modulator typically includes a single shutter that can be moved over an aperture through which light is propagated. In some implementations, the light modulators can be controlled to be in a transmissive state, an obstructing state, or one or more states of partial obstruction.

In some display schemes, gray scale can be achieved using a time division gray scale, in which the image frame is separated into more than one subframe per color. For example, an image frame can be separated into two, three, four, five, six or more subframes per color. In some time division gray scale processes, each subframe for a color is displayed for a varying duration and or at a varying light source intensity level.

Such schemes benefit greatly if the light modulators used are multi-state light modulators. Multi-state light modulators allow a display to generate additional levels of gray scale with fewer subframes. They do so by providing fully transmissive, partially transmissive, or fully obstructive states. However, rendering accurate gray scale requires accurate control of the position of the shutter in the partially transmissive states.

SUMMARY

The systems, methods and devices of the disclosure each have several innovative aspects, no single one of which is solely responsible for the desirable attributes disclosed herein.

One innovative aspect of the subject matter described in this disclosure can be implemented in an apparatus having an apparatus that includes a light blocking layer. The apparatus further includes an aperture for passing light, a first shutter disposed at a first height over a substrate, the first shutter configured to modulate light propagating through the aperture, and a second shutter disposed at a second height over the substrate, the second height being unequal to the first height, the second shutter configured to modulate light propagating through the aperture.

In some implementations, the first shutter is further configured to operate in a first open position and a first closed position, such that when in the first open position the first shutter does not obstruct the aperture and such that when in the first closed position the first shutter obstructs a first portion of the aperture, and where the second shutter is further configured to operate in a second open position and a second closed position, such that when in the second open position the second shutter does not obstruct the aperture and such that when in the second closed position the second shutter obstructs a second portion of the aperture.

In some implementations, the first shutter is further configured to operate in the first open position when the second shutter is operating in the second closed position and to operate in the first closed position when the second shutter is operating in the second open position. In some implementations, an area of the first portion is unequal to an area of the second portion.

In some implementations, the first shutter is further configured to operate in the first open position when the second shutter is operating in the second open position and to operate in the first closed position when the second shutter is operating in the second closed position. In some implementations, the aperture has a cross slot shape. In some other implementations, the aperture has a curved slot shape.

In some implementations, the apparatus further includes a display, a processor that is configured to communicate with the display, the processor being configured to process image data, and a memory device that is configured to communicate with the processor. In some implementations, the apparatus further includes a driver circuit configured to send at least one signal to the display, and a controller configured to send at least a portion of the image data to the driver circuit.

In some implementations, the apparatus further includes an image source module configured to send the image data to the processor, where the image source module includes at least one of a receiver, transceiver, and transmitter. In some implementations, the apparatus further includes an input device configured to receive input data and to communicate the input data to the processor.

Another innovative aspect of the subject matter described in this disclosure can be implemented in a method for forming a multi-level display device, that includes forming a first mold over a substrate, patterning a first shutter material over the first mold to form a first shutter, forming a second mold over the first shutter, and patterning a second shutter material over the second mold to form a second shutter. In some implementations, the method further includes removing the first mold and the second mold after patterning the second shutter material.

In some implementations, the method further includes forming an aperture in an aperture layer deposited on the substrate prior to forming the first mold. In some other implementations, the patterning the first shutter material includes forming a width of the first shutter that is smaller than a width of the aperture; and where patterning the second shutter material includes forming a width of the second shutter that is smaller than the width of the aperture.

Another innovative aspect of the subject matter described in this disclosure can be implemented in an aperture having light blocking means including an aperture for passing light, first light modulating means, disposed at a first height over a substrate, for modulating light propagating through the aperture, and second light modulating means, disposed at a second height over the substrate, the second height being unequal to the first height, for modulating light propagating through the aperture.

In some implementations, the first light modulating means is configured to operate in a first open position and a first closed position, such that when in the first open position the first light modulating means is configured to not obstruct the aperture and when in the first closed position the first light modulating means is configured to obstruct a first portion of the aperture. The second light modulating means is configured to operate in a second open position and a second closed position, such that when in the second open position the second light modulating means is configured to not obstruct the aperture and in the second closed position the second light modulating means is configured to obstruct a second portion of the aperture.

In some implementations, the first light modulating means is configured to operate in the first open position when the second light modulating means is operating in the second closed position and to operate in the first closed position when the second light modulating means is operating in the second open position. In some implementations, an area of the first portion is unequal to an area of the second portion.

In some implementations, the first light modulating means is further configured to operate in the first open position when the second shutter is operating in the second open position and to operate in the first closed position when the second shutter is operating in the second closed position.

Details of one or more implementations of the subject matter described in this specification are set forth in the accompanying drawings and the description below. Although the examples provided in this summary are primarily described in terms of MEMS-based displays, the concepts provided herein may apply to other types of displays, such as liquid crystal displays (LCDs), organic light emitting diode (OLED) displays, electrophoretic displays, and field emission displays, as well as to other non-display MEMS devices, such as MEMS microphones, sensors, and optical switches. Other features, aspects, and advantages will become apparent from the description, the drawings, and the claims. Note that the relative dimensions of the following figures may not be drawn to scale.

BRIEF DESCRIPTION OF THE DRAWINGS

FIG. 4A and FIG. 4B show example views of a dual actuator shutter assembly.

FIGS. 9A-9D show various example top views of states of the multi-level shutters of the display apparatus of FIG. 8.

Like reference numbers and designations in the various drawings indicate like elements.

DETAILED DESCRIPTION

Figure 1A:
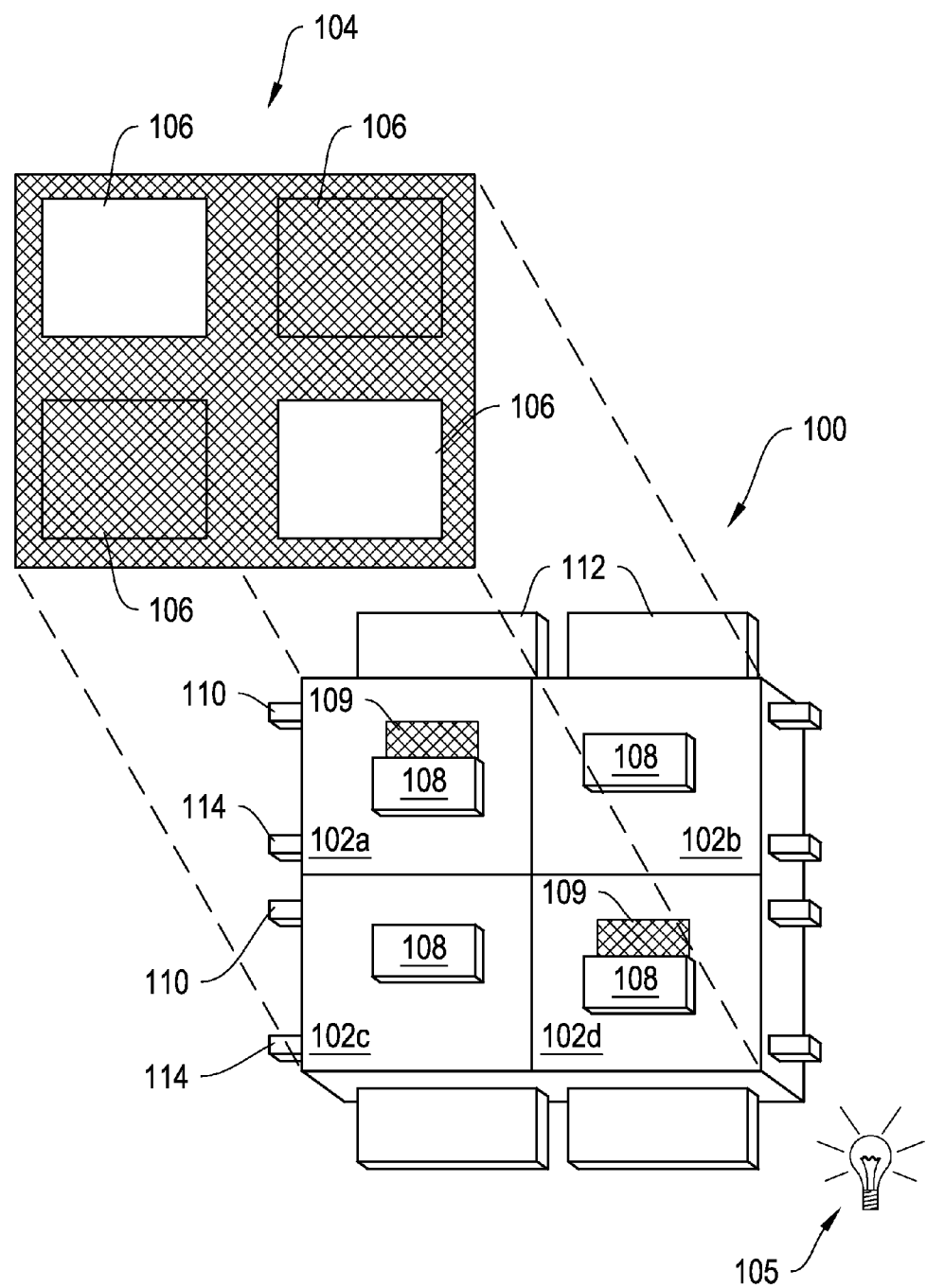
FIG. 1A shows an example schematic diagram of a direct-view MEMS-based display apparatus.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (such as e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

A multi-state shutter assembly can include multiple shutters positioned at different heights. Each shutter within the shutter assembly is configured to operate between two states. That is, each shutter operates between an open state, in which it does not obstruct the passage of light passing through an aperture, and a closed state, in which the shutter at least partially obstructs the light passing through the aperture. By operating the shutters such that at least one of the multiple shutters is in the open state and another one of the multiple shutters is in the closed state, intermediate states can be provided for the shutter assembly as a whole.

In some implementations, the multi-state shutter assembly can have two shutters, positioned at different heights, each configured to operate between the two states mentioned above (i.e., the open state and the closed state). In such implementations, the shutter assembly can operate in four states: a fully transmissive state, a fully obstructive state and two partially transmissive states. In the fully transmissive state, both the shutters are in an open state. In the fully obstructive state, both the shutters are in the closed state. In the two partially transmissive states, one of the two shutters is in the closed state while the other of the two shutters is in the open state.

In some implementations, the degrees to which different shutters, in their respective closed positions, allow light to pass to or from the aperture are different. This can be achieved by having the shutters cover the aperture to different degrees. One shutter, in the closed position, may cover, for example, 25-50% of the total area of the aperture, while the other shutter, in its respective closed position, may cover, for example, 60-80% of the total area of the aperture. Thus, in the first transmissive state, in which only the first one of the two shutters is in the closed position, the amount of light allowed to pass will be different from the amount of light allowed to pass in the second transmissive state in which only the second one of the two shutters is in the closed position. This allows the shutter assembly to allow or obstruct different amounts of light in the two partially transmissive states.

In some implementations, the aperture can have a rectangular shape. Accordingly, the shutter assembly can include rectangular shape multi-level shutters. Alternatively, the aperture can have different shapes such as a cross-slot shape or a curved shape. The shapes and sizes of the multi-level shutters can be appropriately designed such that each shutter can be individually operated in an open state and a closed state to provide multi-state operation for the shutter assembly.

Particular implementations of the subject matter described in this disclosure can be implemented to realize one or more of the following potential advantages. By providing multi-level two-state shutters, a shutter assembly can provide multi-state operation (i.e., two or more state operation). Each of the multi-level shutters is operated between two-states, which can be precisely and reliably achieved using relatively less complex circuitry. These two-state shutters, which are positioned at different levels, are used together to provide more than two total states of operation for the shutter assembly as a whole. By virtue of employing multiple reliably and precisely controllable two-state shutters, the operation of the shutter assembly between each of its various states of operation also can be precise and reliable.

Each of the multi-level shutters can be implemented to partially obstruct an aperture in the closed state while not substantially obstructing the aperture in the open state. In some implementations, the extent to which each of the multi-level shutters obstructs the aperture in its respective closed state is different. This allows the shutter assembly to operate in two distinct intermediate states with varying light passing capabilities, providing the shutter assembly a total of four distinct states: a fully transmissive state, a first partially transmissive state, a second partially transmissive state, and a fully obstructive state.

Having two separate shutters at different levels to achieve the fully obstructive and fully transmissive states provides the benefit of faster operation and lower risk of stiction. As mentioned above, the two shutters partially cover the aperture in their respective closed states to achieve a fully closed state of the shutter assembly. This means that each shutter has to travel only a fraction of the total width of the aperture to achieve a fully obstructive state, as compared to a single shutter design, which requires the shutter to travel at least the full width of the aperture to fully obstruct the aperture. As the distance traveled by each shutter is reduced, the time required to move the shutter is also reduced. Therefore, the shutter assembly, as a whole can transition in and out of the fully transmissive or fully obstructive states relatively faster.

Furthermore, as the shutters are situated at different levels, they do not come in contact when the shutter assembly is in the fully obstructive state. As a result, the risk of the two shutters adhering to each other due to stiction is reduced.

In some implementations, the aperture has a cross-slot shape for improving the consistency in light distribution and contrast ratio over various viewing angles.

FIG. 1A shows a schematic diagram of a direct-view MEMS-based display apparatus 100. The display apparatus 100 includes a plurality of light modulators 102a-102d (generally "light modulators 102") arranged in rows and columns. In the display apparatus 100, the light modulators 102a and 102d are in the open state, allowing light to pass. The light modulators 102b and 102c are in the closed state, obstructing the passage of light. By selectively setting the states of the light modulators 102a-102d, the display apparatus 100 can be utilized to form an image 104 for a backlit display, if illuminated by a lamp or lamps 105. In another implementation, the apparatus 100 may form an image by reflection of ambient light originating from the front of the apparatus. In another implementation, the apparatus 100 may form an image by reflection of light from a lamp or lamps positioned in the front of the display, i.e., by use of a front light.

In some implementations, each light modulator 102 corresponds to a pixel 106 in the image 104. In some other implementations, the display apparatus 100 may utilize a plurality of light modulators to form a pixel 106 in the image 104. For example, the display apparatus 100 may include three color-specific light modulators 102. By selectively opening one or more of the color-specific light modulators 102 corresponding to a particular pixel 106, the display apparatus 100 can generate a color pixel 106 in the image 104. In another example, the display apparatus 100 includes two or more light modulators 102 per pixel 106 to provide luminance level in an image 104. With respect to an image, a "pixel" corresponds to the smallest picture element defined by the resolution of image. With respect to structural components of the display apparatus 100, the term "pixel" refers to the combined mechanical and electrical components utilized to modulate the light that forms a single pixel of the image.

The display apparatus 100 is a direct-view display in that it may not include imaging optics typically found in projection applications. In a projection display, the image formed on the surface of the display apparatus is projected onto a screen or onto a wall. The display apparatus is substantially smaller than the projected image. In a direct view display, the user sees the image by looking directly at the display apparatus, which contains the light modulators and optionally a backlight or front light for enhancing brightness and/or contrast seen on the display.

Direct-view displays may operate in either a transmissive or reflective mode. In a transmissive display, the light modulators filter or selectively block light which originates from a lamp or lamps positioned behind the display. The light from the lamps is optionally injected into a lightguide or "backlight" so that each pixel can be uniformly illuminated. Transmissive direct-view displays are often built onto transparent or glass substrates to facilitate a sandwich assembly arrangement where one substrate, containing the light modulators, is positioned directly on top of the backlight.

Each light modulator 102 can include a shutter 108 and an aperture 109. To illuminate a pixel 106 in the image 104, the shutter 108 is positioned such that it allows light to pass through the aperture 109 towards a viewer. To keep a pixel 106 unlit, the shutter 108 is positioned such that it obstructs the passage of light through the aperture 109. The aperture 109 is defined by an opening patterned through a reflective or light-absorbing material in each light modulator 102.

The display apparatus also includes a control matrix connected to the substrate and to the light modulators for controlling the movement of the shutters. The control matrix includes a series of electrical interconnects (such as interconnects 110, 112 and 114), including at least one write-enable interconnect 110 (also referred to as a "scan-line interconnect") per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the "write-enabling voltage, VWE"), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In some other implementations, the data voltage pulses control switches, such as transistors or other non-linear circuit elements that control the application of separate actuation voltages, which are typically higher in magnitude than the data voltages, to the light modulators 102. The application of these actuation voltages then results in the electrostatic driven movement of the shutters 108.

Figure 1B:
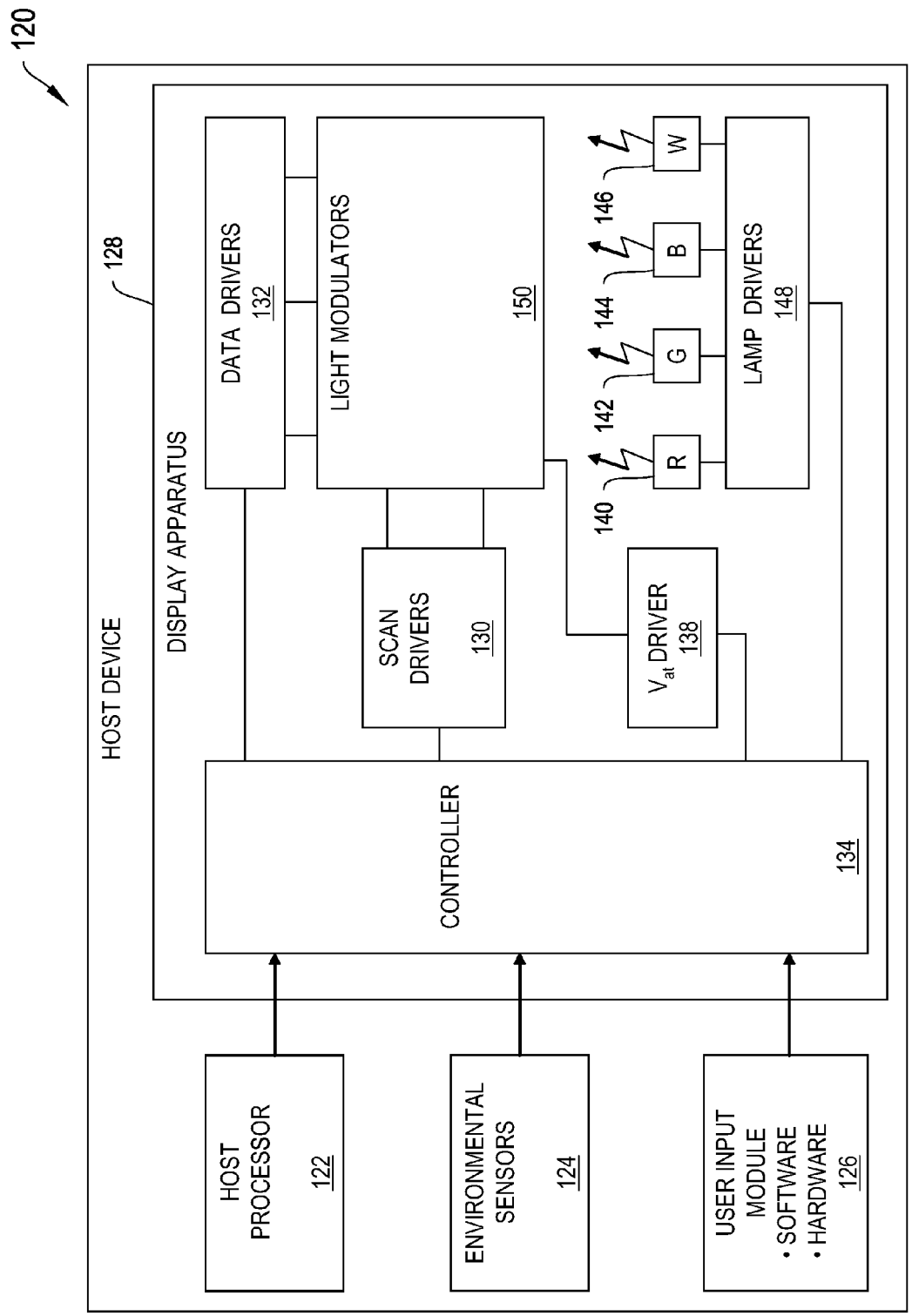
FIG. 1B shows an example block diagram of a host device.

FIG. 1B shows an example of a block diagram of a host device 120 (i.e., cell phone, smart phone, PDA, MP3 player, tablet, e-reader, netbook, notebook, etc.). The host device 120 includes a display apparatus 128, a host processor 122, environmental sensors 124, a user input module 126, and a power source.

The display apparatus 128 includes a plurality of scan drivers 130 (also referred to as "write enabling voltage sources"), a plurality of data drivers 132 (also referred to as "data voltage sources"), a controller 134, common drivers 138, lamps 140-146, lamp drivers 148 and an array 150 of display elements, such as the light modulators 102 shown in FIG. 1A. The scan drivers 130 apply write enabling voltages to scan-line interconnects 110. The data drivers 132 apply data voltages to the data interconnects 112.

In some implementations of the display apparatus, the data drivers 132 are configured to provide analog data voltages to the array 150 of display elements, especially where the luminance level of the image 104 is to be derived in analog fashion. In analog operation, the light modulators 102 are designed such that when a range of intermediate voltages is applied through the data interconnects 112, there results a range of intermediate open states in the shutters 108 and therefore a range of intermediate illumination states or luminance levels in the image 104. In other cases, the data drivers 132 are configured to apply only a reduced set of 2, 3 or 4 digital voltage levels to the data interconnects 112. These voltage levels are designed to set, in digital fashion, an open state, a closed state, or other discrete state to each of the shutters 108.

The scan drivers 130 and the data drivers 132 are connected to a digital controller circuit 134 (also referred to as the "controller 134"). The controller sends data to the data drivers 132 in a mostly serial fashion, organized in predetermined sequences grouped by rows and by image frames. The data drivers 132 can include series to parallel data converters, level shifting, and for some applications digital to analog voltage converters.

The display apparatus optionally includes a set of common drivers 138, also referred to as common voltage sources. In some implementations, the common drivers 138 provide a DC common potential to all display elements within the array 150 of display elements, for instance by supplying voltage to a series of common interconnects 114. In some other implementations, the common drivers 138, following commands from the controller 134, issue voltage pulses or signals to the array 150 of display elements, for instance global actuation pulses which are capable of driving and/or initiating simultaneous actuation of all display elements in multiple rows and columns of the array 150.

All of the drivers (such as scan drivers 130, data drivers 132 and common drivers 138) for different display functions are time-synchronized by the controller 134. Timing commands from the controller coordinate the illumination of red, green and blue and white lamps (140, 142, 144 and 146 respectively) via lamp drivers 148, the write-enabling and sequencing of specific rows within the array 150 of display elements, the output of voltages from the data drivers 132, and the output of voltages that provide for display element actuation. In some implementations, the lamps are light emitting diodes (LEDs).

The controller 134 determines the sequencing or addressing scheme by which each of the shutters 108 can be re-set to the illumination levels appropriate to a new image 104. New images 104 can be set at periodic intervals. For instance, for video displays, the color images 104 or frames of video are refreshed at frequencies ranging from 10 to 300 Hertz (Hz). In some implementations the setting of an image frame to the array 150 is synchronized with the illumination of the lamps 140, 142, 144 and 146 such that alternate image frames are illuminated with an alternating series of colors, such as red, green, and blue. The image frames for each respective color is referred to as a color subframe. In this method, referred to as the field sequential color method, if the color subframes are alternated at frequencies in excess of 20 Hz, the human brain will average the alternating frame images into the perception of an image having a broad and continuous range of colors. In alternate implementations, four or more lamps with primary colors can be employed in display apparatus 100, employing primaries other than red, green, and blue.

In some implementations, where the display apparatus 100 is designed for the digital switching of shutters 108 between open and closed states, the controller 134 forms an image by the method of time division gray scale, as previously described. In some other implementations, the display apparatus 100 can provide gray scale through the use of multiple shutters 108 per pixel.

In some implementations, the data for an image state 104 is loaded by the controller 134 to the display element array 150 by a sequential addressing of individual rows, also referred to as scan lines. For each row or scan line in the sequence, the scan driver 130 applies a write-enable voltage to the write enable interconnect 110 for that row of the array 150, and subsequently the data driver 132 supplies data voltages, corresponding to desired shutter states, for each column in the selected row. This process repeats until data has been loaded for all rows in the array 150. In some implementations, the sequence of selected rows for data loading is linear, proceeding from top to bottom in the array 150. In some other implementations, the sequence of selected rows is pseudo-randomized, in order to minimize visual artifacts. And in some other implementations the sequencing is organized by blocks, where, for a block, the data for only a certain fraction of the image state 104 is loaded to the array 150, for instance by addressing only every 5th row of the array 150 in sequence.

In some implementations, the process for loading image data to the array 150 is separated in time from the process of actuating the display elements in the array 150. In these implementations, the display element array 150 may include data memory elements for each display element in the array 150 and the control matrix may include a global actuation interconnect for carrying trigger signals, from common driver 138, to initiate simultaneous actuation of shutters 108 according to data stored in the memory elements.

In alternative implementations, the array 150 of display elements and the control matrix that controls the display elements may be arranged in configurations other than rectangular rows and columns. For example, the display elements can be arranged in hexagonal arrays or curvilinear rows and columns. In general, as used herein, the term scan-line shall refer to any plurality of display elements that share a write-enabling interconnect.

The host processor 122 generally controls the operations of the host. For example, the host processor 122 may be a general or special purpose processor for controlling a portable electronic device. With respect to the display apparatus 128, included within the host device 120, the host processor 122 outputs image data as well as additional data about the host. Such information may include data from environmental sensors, such as ambient light or temperature; information about the host, including, for example, an operating mode of the host or the amount of power remaining in the host's power source; information about the content of the image data; information about the type of image data; and/or instructions for display apparatus for use in selecting an imaging mode.

The user input module 126 conveys the personal preferences of the user to the controller 134, either directly, or via the host processor 122. In some implementations, the user input module 126 is controlled by software in which the user programs personal preferences such as "deeper color," "better contrast," "lower power," "increased brightness," "sports," "live action," or "animation." In some other implementations, these preferences are input to the host using hardware, such as a switch or dial. The plurality of data inputs to the controller 134 direct the controller to provide data to the various drivers 130, 132, 138 and 148 which correspond to optimal imaging characteristics.

An environmental sensor module 124 also can be included as part of the host device 120. The environmental sensor module 124 receives data about the ambient environment, such as temperature and or ambient lighting conditions. The sensor module 124 can be programmed to distinguish whether the device is operating in an indoor or office environment versus an outdoor environment in bright daylight versus an outdoor environment at nighttime. The sensor module 124 communicates this information to the display controller 134, so that the controller 134 can optimize the viewing conditions in response to the ambient environment.

Figure 2:
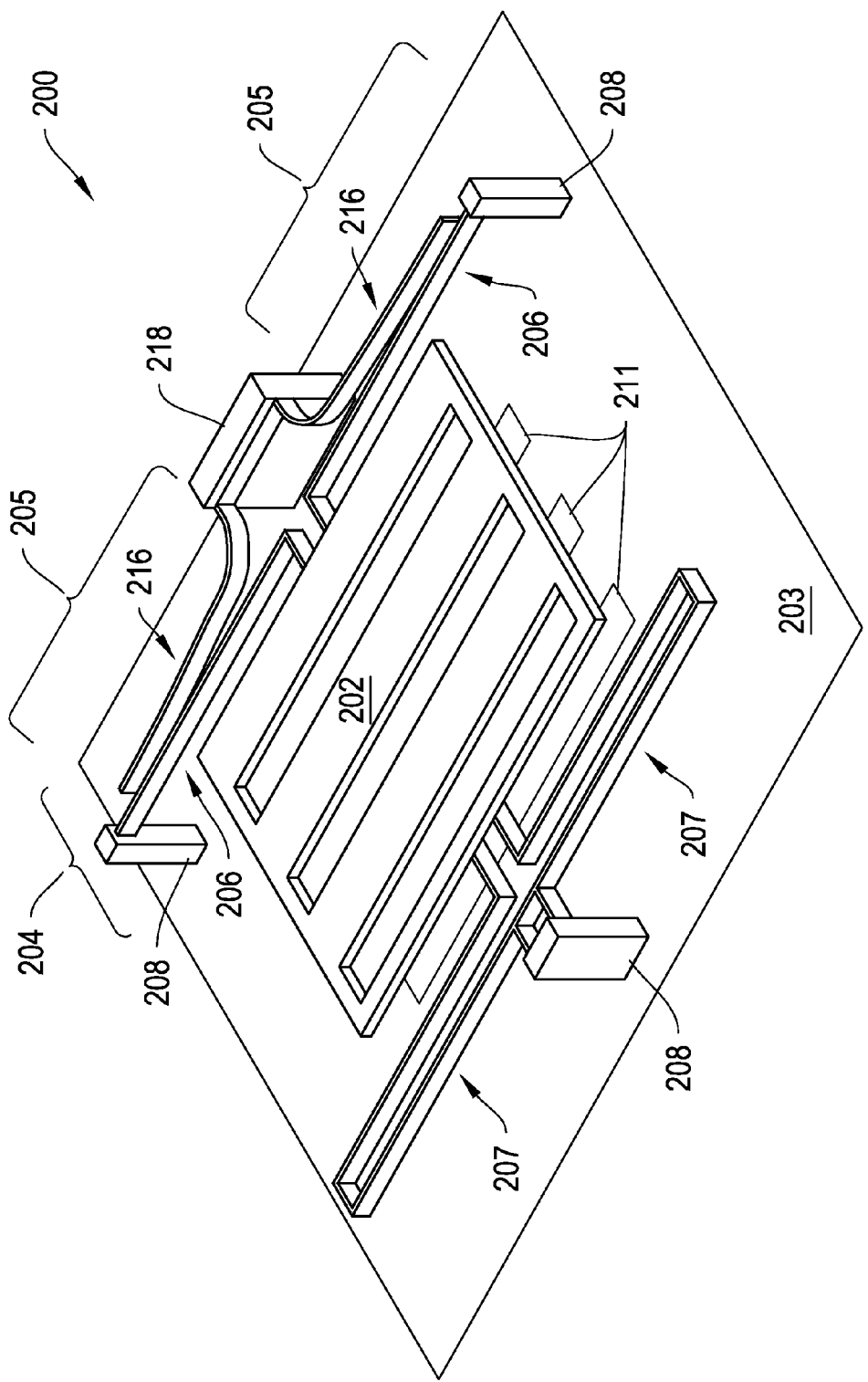
FIG. 2 shows an example perspective view of an illustrative shutter-based light modulator.

FIG. 2 shows an example perspective view of an illustrative shutter-based light modulator 200. The shutter-based light modulator 200 is suitable for incorporation into the direct-view MEMS-based display apparatus 100 of FIG. 1A. The light modulator 200 includes a shutter 202 coupled to an actuator 204. The actuator 204 can be formed from two separate compliant electrode beam actuators 205 (the "actuators 205"). The shutter 202 couples on one side to the actuators 205. The actuators 205 move the shutter 202 transversely over a surface 203 in a plane of motion which is substantially parallel to the surface 203. The opposite side of the shutter 202 couples to a spring 207 which provides a restoring force opposing the forces exerted by the actuator 204.

Each actuator 205 includes a compliant load beam 206 connecting the shutter 202 to a load anchor 208. The load anchors 208 along with the compliant load beams 206 serve as mechanical supports, keeping the shutter 202 suspended proximate to the surface 203. The surface 203 includes one or more aperture holes 211 for admitting the passage of light. The load anchors 208 physically connect the compliant load beams 206 and the shutter 202 to the surface 203 and electrically connect the load beams 206 to a bias voltage, in some instances, ground.

If the substrate is opaque, such as silicon, then aperture holes 211 are formed in the substrate by etching an array of holes through the substrate. If the substrate is transparent, such as glass or plastic, then the aperture holes 211 are formed in a layer of light-blocking material deposited on the substrate. The aperture holes 211 can be generally circular, elliptical, polygonal, serpentine, or irregular in shape.

Each actuator 205 also includes a compliant drive beam 216 positioned adjacent to each load beam 206. The drive beams 216 couple at one end to a drive beam anchor 218 shared between the drive beams 216. The other end of each drive beam 216 is free to move. Each drive beam 216 is curved such that it is closest to the load beam 206 near the free end of the drive beam 216 and the anchored end of the load beam 206.

In operation, a display apparatus incorporating the light modulator 200 applies an electric potential to the drive beams 216 via the drive beam anchor 218. A second electric potential may be applied to the load beams 206. The resulting potential difference between the drive beams 216 and the load beams 206 pulls the free ends of the drive beams 216 towards the anchored ends of the load beams 206, and pulls the shutter ends of the load beams 206 toward the anchored ends of the drive beams 216, thereby driving the shutter 202 transversely toward the drive anchor 218. The compliant members 206 act as springs, such that when the voltage across the beams 206 and 216 potential is removed, the load beams 206 push the shutter 202 back into its initial position, releasing the stress stored in the load beams 206.

A light modulator, such as the light modulator 200, incorporates a passive restoring force, such as a spring, for returning a shutter to its rest position after voltages have been removed. Other shutter assemblies can incorporate a dual set of "open" and "closed" actuators and separate sets of "open" and "closed" electrodes for moving the shutter into either an open or a closed state.

There are a variety of methods by which an array of shutters and apertures can be controlled via a control matrix to produce images, in many cases moving images, with appropriate luminance levels. In some cases, control is accomplished by means of a passive matrix array of row and column interconnects connected to driver circuits on the periphery of the display. In other cases, it is appropriate to include switching and/or data storage elements within each pixel of the array (the so-called active matrix) to improve the speed, the luminance level and/or the power dissipation performance of the display.

Figure 3A:
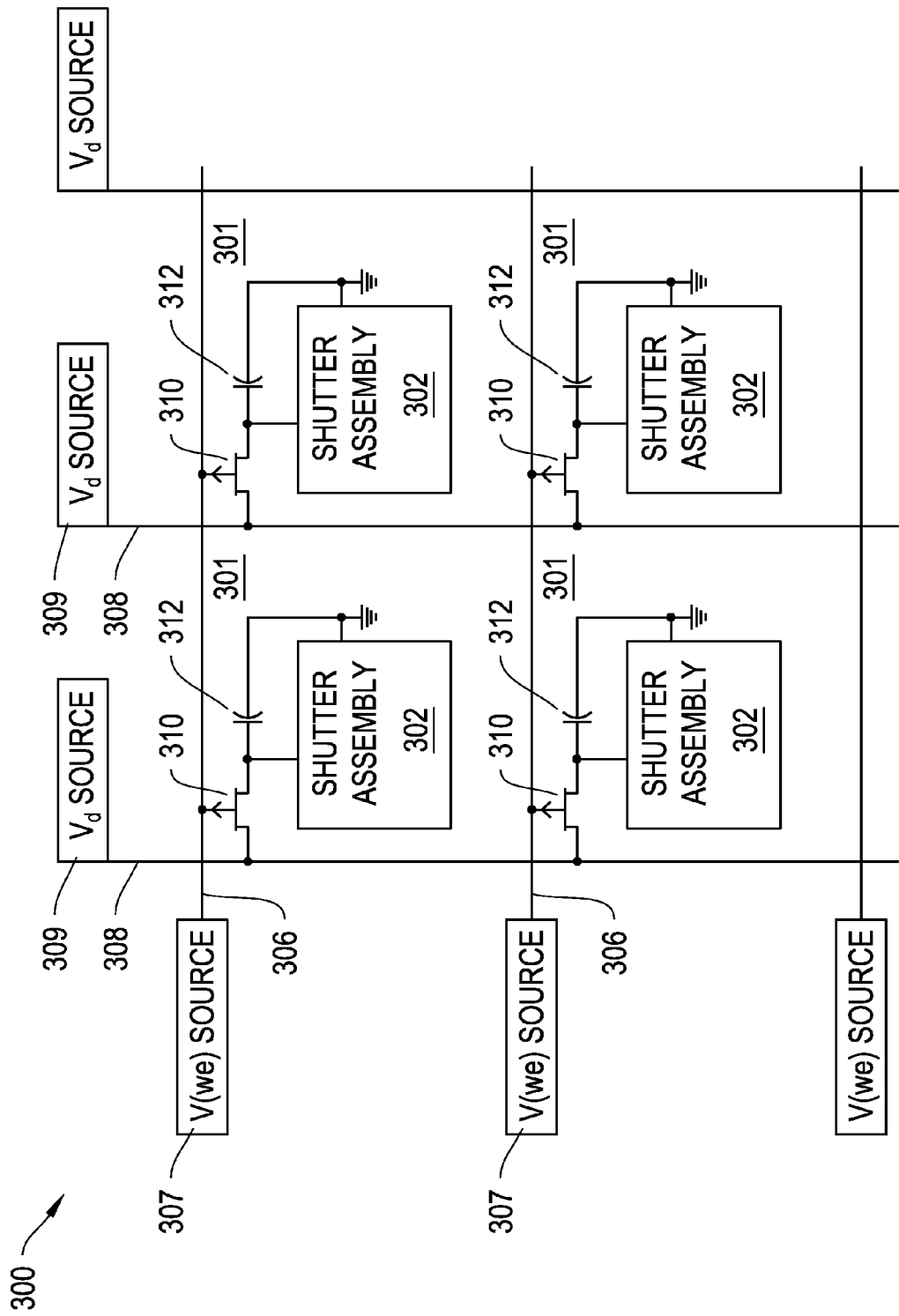
FIG. 3A shows an example schematic diagram of a control matrix.
Figure 3B:
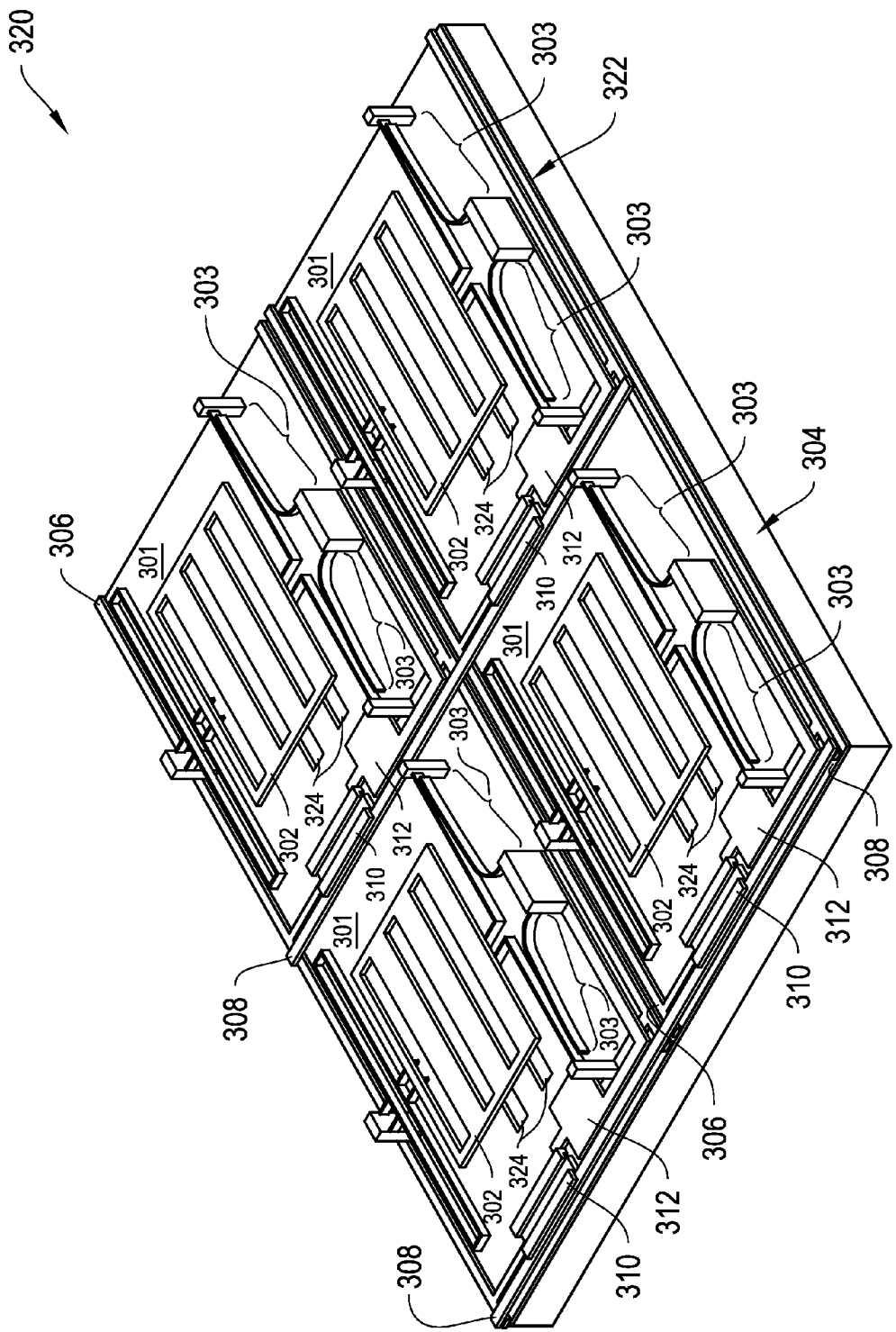
FIG. 3B shows a perspective view of an example array of shutter-based light modulators connected to the control matrix of FIG. 3A.

FIG. 3A shows an example schematic diagram of a control matrix 300. The control matrix 300 is suitable for controlling the light modulators incorporated into the MEMS-based display apparatus 100 of FIG. 1A. FIG. 3B shows a perspective view of an example array 320 of shutter-based light modulators connected to the control matrix 300 of FIG. 3A. The control matrix 300 may address an array of pixels 320 (the "array 320"). Each pixel 301 can include an elastic shutter assembly 302, such as the shutter assembly 200 of FIG. 2, controlled by an actuator 303. Each pixel also can include an aperture layer 322 that includes apertures 324.

The control matrix 300 is fabricated as a diffused or thin-film-deposited electrical circuit on the surface of a substrate 304 on which the shutter assemblies 302 are formed. The control matrix 300 includes a scan-line interconnect 306 for each row of pixels 301 in the control matrix 300 and a data-interconnect 308 for each column of pixels 301 in the control matrix 300. Each scan-line interconnect 306 electrically connects a write-enabling voltage source 307 to the pixels 301 in a corresponding row of pixels 301. Each data interconnect 308 electrically connects a data voltage source 309 ("Vd source") to the pixels 301 in a corresponding column of pixels. In the control matrix 300, the Vd source 309 provides the majority of the energy to be used for actuation of the shutter assemblies 302. Thus, the data voltage source, Vd source 309, also serves as an actuation voltage source.

Referring to FIGS. 3A and 3B, for each pixel 301 or for each shutter assembly 302 in the array of pixels 320, the control matrix 300 includes a transistor 310 and a capacitor 312. The gate of each transistor 310 is electrically connected to the scan-line interconnect 306 of the row in the array 320 in which the pixel 301 is located. The source of each transistor 310 is electrically connected to its corresponding data interconnect 308. The actuators 303 of each shutter assembly 302 include two electrodes. The drain of each transistor 310 is electrically connected in parallel to one electrode of the corresponding capacitor 312 and to one of the electrodes of the corresponding actuator 303. The other electrode of the capacitor 312 and the other electrode of the actuator 303 in shutter assembly 302 are connected to a common or ground potential. In alternate implementations, the transistors 310 can be replaced with semiconductor diodes and or metal-insulator-metal sandwich type switching elements.

In operation, to form an image, the control matrix 300 write-enables each row in the array 320 in a sequence by applying Vwe to each scan-line interconnect 306 in turn. For a write-enabled row, the application of Vwe to the gates of the transistors 310 of the pixels 301 in the row allows the flow of current through the data interconnects 308 through the transistors 310 to apply a potential to the actuator 303 of the shutter assembly 302. While the row is write-enabled, data voltages Vd are selectively applied to the data interconnects 308. In implementations providing analog gray scale, the data voltage applied to each data interconnect 308 is varied in relation to the desired brightness of the pixel 301 located at the intersection of the write-enabled scan-line interconnect 306 and the data interconnect 308. In implementations providing digital control schemes, the data voltage is selected to be either a relatively low magnitude voltage (i.e., a voltage near ground) or to meet or exceed Vat (the actuation threshold voltage). In response to the application of Vat to a data interconnect 308, the actuator 303 in the corresponding shutter assembly actuates, opening the shutter in that shutter assembly 302. The voltage applied to the data interconnect 308 remains stored in the capacitor 312 of the pixel 301 even after the control matrix 300 ceases to apply Vwe to a row. Therefore, the voltage Vwe does not have to wait and hold on a row for times long enough for the shutter assembly 302 to actuate; such actuation can proceed after the write-enabling voltage has been removed from the row. The capacitors 312 also function as memory elements within the array 320, storing actuation instructions for the illumination of an image frame.

The pixels 301 as well as the control matrix 300 of the array 320 are formed on a substrate 304. The array 320 includes an aperture layer 322, disposed on the substrate 304, which includes a set of apertures 324 for respective pixels 301 in the array 320. The apertures 324 are aligned with the shutter assemblies 302 in each pixel. In some implementations, the substrate 304 is made of a transparent material, such as glass or plastic. In some other implementations, the substrate 304 is made of an opaque material, but in which holes are etched to form the apertures 324.

The shutter assembly 302 together with the actuator 303 can be made bi-stable. That is, the shutters can exist in at least two equilibrium positions (such as open or closed) with little or no power required to hold them in either position. More particularly, the shutter assembly 302 can be mechanically bi-stable. Once the shutter of the shutter assembly 302 is set in position, no electrical energy or holding voltage is required to maintain that position. The mechanical stresses on the physical elements of the shutter assembly 302 can hold the shutter in place.

The shutter assembly 302 together with the actuator 303 also can be made electrically bi-stable. In an electrically bi-stable shutter assembly, there exists a range of voltages below the actuation voltage of the shutter assembly, which if applied to a closed actuator (with the shutter being either open or closed), holds the actuator closed and the shutter in position, even if an opposing force is exerted on the shutter. The opposing force may be exerted by a spring such as the spring 207 in the shutter-based light modulator 200 depicted in FIG. 2, or the opposing force may be exerted by an opposing actuator, such as an "open" or "closed" actuator.

The light modulator array 320 is depicted as having a single MEMS light modulator per pixel. Other implementations are possible in which multiple MEMS light modulators are provided in each pixel, thereby providing the possibility of more than just binary "on" or "off" optical states in each pixel. Certain forms of coded area division gray scale are possible where multiple MEMS light modulators in the pixel are provided, and where apertures 324, which are associated with each of the light modulators, have unequal areas.

FIGS. 4A and 4B show example views of a dual actuator shutter assembly 400. The dual actuator shutter assembly 400, as depicted in FIG. 4A, is in an open state. FIG. 4B shows the dual actuator shutter assembly 400 in a closed state. In contrast to the shutter assembly 200, the shutter assembly 400 includes actuators 402 and 404 on either side of a shutter 406. Each actuator 402 and 404 is independently controlled. A first actuator, a shutter-open actuator 402, serves to open the shutter 406. A second opposing actuator, the shutter-close actuator 404, serves to close the shutter 406. Both of the actuators 402 and 404 are compliant beam electrode actuators. The actuators 402 and 404 open and close the shutter 406 by driving the shutter 406 substantially in a plane parallel to an aperture layer 407 over which the shutter is suspended. The shutter 406 is suspended a short distance over the aperture layer 407 by anchors 408 attached to the actuators 402 and 404. The inclusion of supports attached to both ends of the shutter 406 along its axis of movement reduces out of plane motion of the shutter 406 and confines the motion substantially to a plane parallel to the substrate. By analogy to the control matrix 300 of FIG. 3A, a control matrix suitable for use with the shutter assembly 400 might include one transistor and one capacitor for each of the opposing shutter-open and shutter-close actuators 402 and 404.

The shutter 406 includes two shutter apertures 412 through which light can pass. The aperture layer 407 includes a set of three apertures 409. In FIG. 4A, the shutter assembly 400 is in the open state and, as such, the shutter-open actuator 402 has been actuated, the shutter-close actuator 404 is in its relaxed position, and the centerlines of the shutter apertures 412 coincide with the centerlines of two of the aperture layer apertures 409. In FIG. 4B, the shutter assembly 400 has been moved to the closed state and, as such, the shutter-open actuator 402 is in its relaxed position, the shutter-close actuator 404 has been actuated, and the light blocking portions of the shutter 406 are now in position to block transmission of light through the apertures 409 (depicted as dotted lines).

Each aperture has at least one edge around its periphery. For example, the rectangular apertures 409 have four edges.

In alternative implementations in which circular, elliptical, oval, or other curved apertures are formed in the aperture layer 407, each aperture may have only a single edge. In some other implementations, the apertures need not be separated or disjoint in the mathematical sense, but instead can be connected. That is to say, while portions or shaped sections of the aperture may maintain a correspondence to each shutter, several of these sections may be connected such that a single continuous perimeter of the aperture is shared by multiple shutters.

In order to allow light with a variety of exit angles to pass through apertures 412 and 409 in the open state, it is advantageous to provide a width or size for shutter apertures 412 which is larger than a corresponding width or size of apertures 409 in the aperture layer 407. In order to effectively block light from escaping in the closed state, it is preferable that the light blocking portions of the shutter 406 overlap the apertures 409. FIG. 4B shows a predefined overlap 416 between the edge of light blocking portions in the shutter 406 and one edge of the aperture 409 formed in the aperture layer 407.

The electrostatic actuators 402 and 404 are designed so that their voltage-displacement behavior provides a bi-stable characteristic to the shutter assembly 400. For each of the shutter-open and shutter-close actuators there exists a range of voltages below the actuation voltage, which if applied while that actuator is in the closed state (with the shutter being either open or closed), will hold the actuator closed and the shutter in position, even after an actuation voltage is applied to the opposing actuator. The minimum voltage needed to maintain a shutter's position against such an opposing force is referred to as a maintenance voltage Vm.

Figure 5:
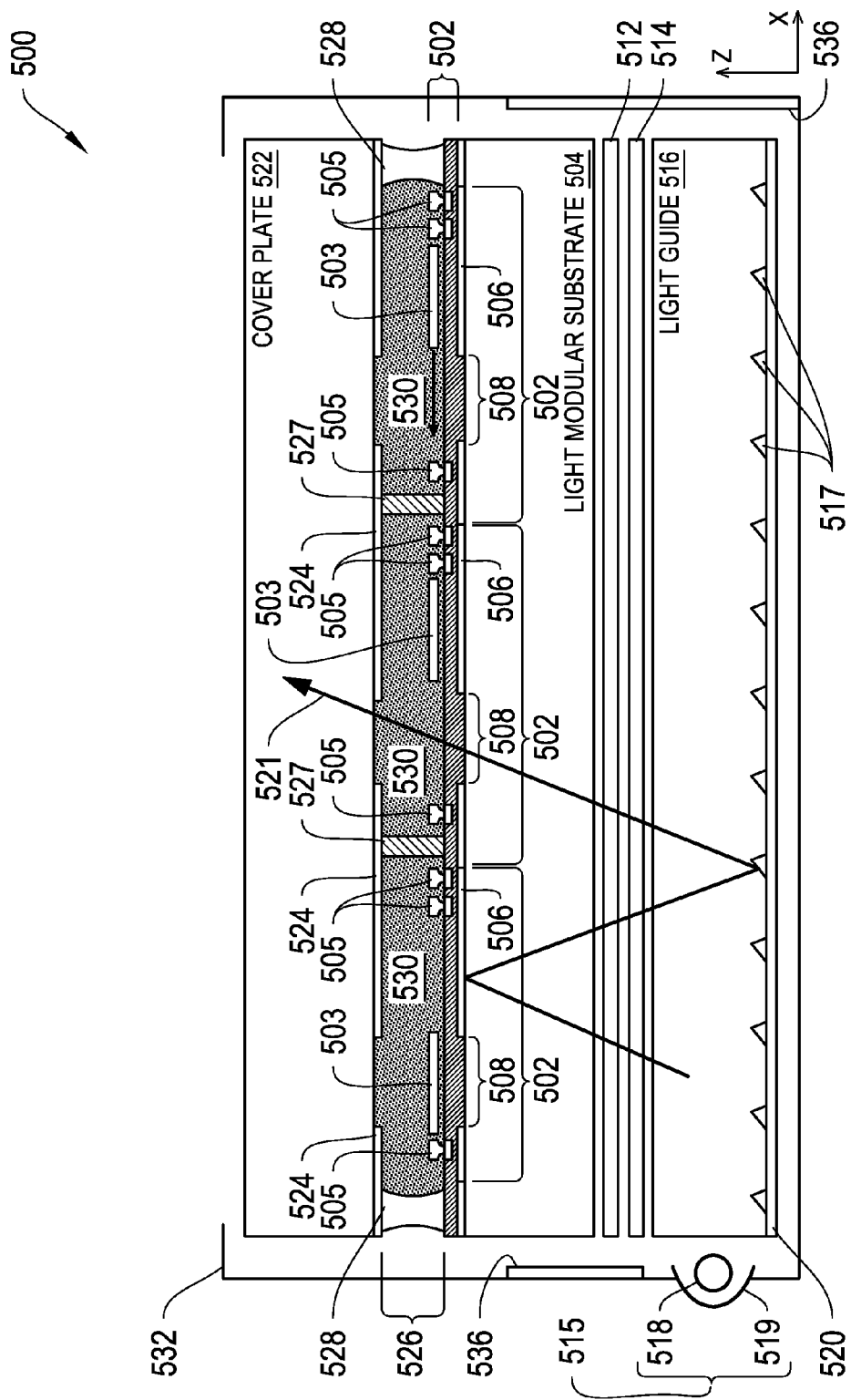
FIG. 5 shows an example cross sectional view of a display apparatus incorporating shutter-based light modulators.

FIG. 5 shows an example cross sectional view of a display apparatus 500 incorporating shutter-based light modulators (shutter assemblies) 502. Each shutter assembly 502 incorporates a shutter 503 and an anchor 505. Not shown are the compliant beam actuators which, when connected between the anchors 505 and the shutters 503, help to suspend the shutters 503 a short distance above the surface. The shutter assemblies 502 are disposed on a transparent substrate 504, such a substrate made of plastic or glass. A rear-facing reflective layer, reflective film 506, disposed on the substrate 504 defines a plurality of surface apertures 508 located beneath the closed positions of the shutters 503 of the shutter assemblies 502. The reflective film 506 reflects light not passing through the surface apertures 508 back towards the rear of the display apparatus 500. The reflective aperture layer 506 can be a fine-grained metal film without inclusions formed in thin film fashion by a number of vapor deposition techniques including sputtering, evaporation, ion plating, laser ablation, or chemical vapor deposition (CVD). In some other implementations, the rear-facing reflective layer 506 can be formed from a mirror, such as a dielectric mirror. A dielectric mirror can be fabricated as a stack of dielectric thin films which alternate between materials of high and low refractive index. The vertical gap which separates the shutters 503 from the reflective film 506, within which the shutter is free to move, is in the range of 0.5 to 10 microns. The magnitude of the vertical gap is preferably less than the lateral overlap between the edge of shutters 503 and the edge of apertures 508 in the closed state, such as the overlap 416 depicted in FIG. 4B.

The display apparatus 500 includes an optional diffuser 512 and/or an optional brightness enhancing film 514 which separate the substrate 504 from a planar light guide 516. The light guide 516 includes a transparent, i.e., glass or plastic material. The light guide 516 is illuminated by one or more light sources 518, forming a backlight. The light sources 518 can be, for example, and without limitation, incandescent lamps, fluorescent lamps, lasers or light emitting diodes (LEDs). A reflector 519 helps direct light from lamp 518 towards the light guide 516. A front-facing reflective film 520 is disposed behind the backlight 516, reflecting light towards the shutter assemblies 502. Light rays such as ray 521 from the backlight that do not pass through one of the shutter assemblies 502 will be returned to the backlight and reflected again from the film 520. In this fashion light that fails to leave the display apparatus 500 to form an image on the first pass can be recycled and made available for transmission through other open apertures in the array of shutter assemblies 502. Such light recycling has been shown to increase the illumination efficiency of the display.

The light guide 516 includes a set of geometric light redirectors or prisms 517 which re-direct light from the lamps 518 towards the apertures 508 and hence toward the front of the display. The light redirectors 517 can be molded into the plastic body of light guide 516 with shapes that can be alternately triangular, trapezoidal, or curved in cross section. The density of the prisms 517 generally increases with distance from the lamp 518.

In some implementations, the aperture layer 506 can be made of a light absorbing material, and in alternate implementations the surfaces of shutter 503 can be coated with either a light absorbing or a light reflecting material. In some other implementations, the aperture layer 506 can be deposited directly on the surface of the light guide 516. In some implementations, the aperture layer 506 need not be disposed on the same substrate as the shutters 503 and anchors 505 (such as in the MEMS-down configuration described below).

In some implementations, the light sources 518 can include lamps of different colors, for instance, the colors red, green and blue. A color image can be formed by sequentially illuminating images with lamps of different colors at a rate sufficient for the human brain to average the different colored images into a single multi-color image. The various color-specific images are formed using the array of shutter assemblies 502. In another implementation, the light source 518 includes lamps having more than three different colors. For example, the light source 518 may have red, green, blue and white lamps, or red, green, blue and yellow lamps. In some other implementations, the light source 518 may include cyan, magenta, yellow and white lamps, red, green, blue and white lamps. In some other implementations, additional lamps may be included in the light source 518. For example, if using five colors, the light source 518 may include red, green, blue, cyan and yellow lamps. In some other implementations, the light source 518 may include white, orange, blue, purple and green lamps or white, blue, yellow, red and cyan lamps. If using six colors, the light source 518 may include red, green, blue, cyan, magenta and yellow lamps or white, cyan, magenta, yellow, orange and green lamps.

A cover plate 522 forms the front of the display apparatus 500. The rear side of the cover plate 522 can be covered with a black matrix 524 to increase contrast. In alternate implementations the cover plate includes color filters, for instance distinct red, green, and blue filters corresponding to different ones of the shutter assemblies 502. The cover plate 522 is supported a predetermined distance away from the shutter assemblies 502 forming a gap 526. The gap 526 is maintained by mechanical supports or spacers 527 and/or by an adhesive seal 528 attaching the cover plate 522 to the substrate 504.

The adhesive seal 528 seals in a fluid 530. The fluid 530 is engineered with viscosities preferably below about 10 centipoise and with relative dielectric constant preferably above about 2.0, and dielectric breakdown strengths above about 104 V/cm. The fluid 530 also can serve as a lubricant. In some implementations, the fluid 530 is a hydrophobic liquid with a high surface wetting capability. In alternate implementations, the fluid 530 has a refractive index that is either greater than or less than that of the substrate 504.

Displays that incorporate mechanical light modulators can include hundreds, thousands, or in some cases, millions of moving elements. In some devices, every movement of an element provides an opportunity for static friction to disable one or more of the elements. This movement is facilitated by immersing all the parts in a fluid (also referred to as fluid 530) and sealing the fluid (such as with an adhesive) within a fluid space or gap in a MEMS display cell. The fluid 530 is usually one with a low coefficient of friction, low viscosity, and minimal degradation effects over the long term. When the MEMS-based display assembly includes a liquid for the fluid 530, the liquid at least partially surrounds some of the moving parts of the MEMS-based light modulator. In some implementations, in order to reduce the actuation voltages, the liquid has a viscosity below 70 centipoise. In some other implementations, the liquid has a viscosity below 10 centipoise. Liquids with viscosities below 70 centipoise can include materials with low molecular weights: below 4000 grams/mole, or in some cases below 400 grams/mole. Fluids 530 that also may be suitable for such implementations include, without limitation, de-ionized water, methanol, ethanol and other alcohols, paraffins, olefins, ethers, silicone oils, fluorinated silicone oils, or other natural or synthetic solvents or lubricants. Useful fluids can be polydimethylsiloxanes (PDMS), such as hexamethyldisiloxane and octamethyltrisiloxane, or alkyl methyl siloxanes such as hexylpentamethyldisiloxane. Useful fluids can be alkanes, such as octane or decane. Useful fluids can be nitroalkanes, such as nitromethane. Useful fluids can be aromatic compounds, such as toluene or diethylbenzene. Useful fluids can be ketones, such as butanone or methyl isobutyl ketone. Useful fluids can be chlorocarbons, such as chlorobenzene. Useful fluids can be chlorofluorocarbons, such as dichlorofluoroethane or chlorotrifluoroethylene. Other fluids considered for these display assemblies include butyl acetate and dimethylformamide. Still other useful fluids for these displays include hydro fluoro ethers, perfluoropolyethers, hydro fluoro poly ethers, pentanol, and butanol. Example suitable hydro fluoro ethers include ethyl nonafluorobutyl ether and 2-trifluoromethyl-3-ethoxydodecafluorohexane.

A sheet metal or molded plastic assembly bracket 532 holds the cover plate 522, the substrate 504, the backlight and the other component parts together around the edges. The assembly bracket 532 is fastened with screws or indent tabs to add rigidity to the combined display apparatus 500. In some implementations, the light source 518 is molded in place by an epoxy potting compound. Reflectors 536 help return light escaping from the edges of the light guide 516 back into the light guide 516. Not depicted in FIG. 5 are electrical interconnects which provide control signals as well as power to the shutter assemblies 502 and the lamps 518.

In some other implementations, the roller-based light modulator 220, the light tap 250, or the electrowetting-based light modulation array 270, as depicted in FIGS. 2A-2D, as well as other MEMS-based light modulators, can be substituted for the shutter assemblies 502 within the display apparatus 500.

The display apparatus 500 is referred to as the MEMS-up configuration, wherein the MEMS based light modulators are formed on a front surface of the substrate 504, i.e., the surface that faces toward the viewer. The shutter assemblies 502 are built directly on top of the reflective aperture layer 506. In an alternate implementation, referred to as the MEMS-down configuration, the shutter assemblies are disposed on a substrate separate from the substrate on which the reflective aperture layer is formed. The substrate on which the reflective aperture layer is formed, defining a plurality of apertures, is referred to herein as the aperture plate. In the MEMS-down configuration, the substrate that carries the MEMS-based light modulators takes the place of the cover plate 522 in the display apparatus 500 and is oriented such that the MEMS-based light modulators are positioned on the rear surface of the top substrate, i.e., the surface that faces away from the viewer and toward the light guide 516. The MEMS-based light modulators are thereby positioned directly opposite to and across a gap from the reflective aperture layer 506. The gap can be maintained by a series of spacer posts connecting the aperture plate and the substrate on which the MEMS modulators are formed. In some implementations, the spacers are disposed within or between each pixel in the array. The gap or distance that separates the MEMS light modulators from their corresponding apertures is preferably less than 10 microns, or a distance that is less than the overlap between shutters and apertures, such as overlap 416.

Figure 6A:
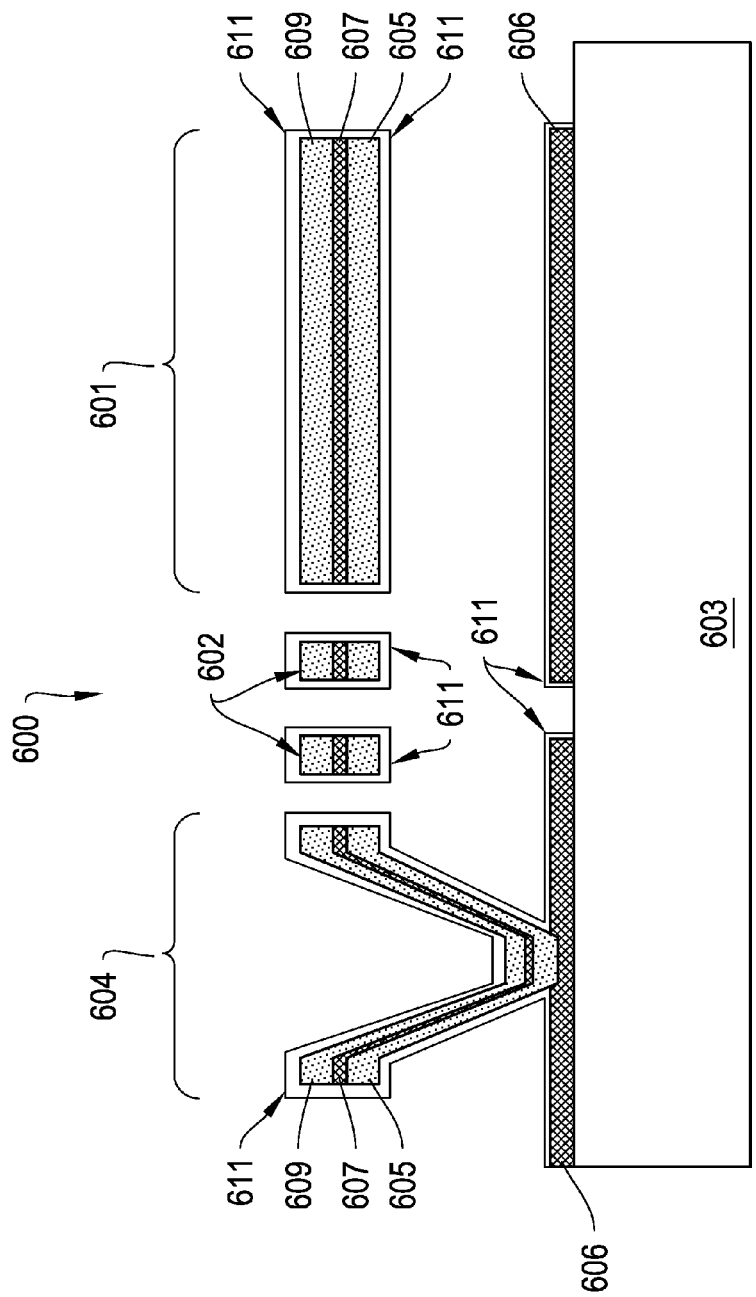
FIGS. 6A-6E show cross sectional views of stages of construction of an example composite shutter assembly.

FIGS. 6A-6E show cross sectional views of stages of construction of an example composite shutter assembly. FIG. 6A shows an example cross sectional diagram of a completed composite shutter assembly 600. The shutter assembly 600 includes a shutter 601, two compliant beams 602, and an anchor structure 604 built-up on a substrate 603 and an aperture layer 606. The elements of the composite shutter assembly 600 include a first mechanical layer 605, a conductor layer 607, a second mechanical layer 609, and an encapsulating dielectric 611. At least one of the mechanical layers 605 or 609 can be deposited to thicknesses in excess of 0.15 microns, as one or both of the mechanical layers 605 or 609 serves as the principal load bearing and mechanical actuation member for the shutter assembly 600, though in some implementations, the mechanical layers 605 and 609 may be thinner. Candidate materials for the mechanical layers 605 and 609 include, without limitation, metals such as aluminum (Al), copper (Cu), nickel (Ni), chromium (Cr), molybdenum (Mo), titanium (Ti), tantalum (Ta), niobium (Nb), neodymium (Nd), or alloys thereof; dielectric materials such as aluminum oxide ($Al_2O_3$), silicon oxide ($SiO_2$), tantalum pentoxide ($Ta_2O_5$), or silicon nitride ($Si_3N_4$); or semiconducting materials such as diamond-like carbon, silicon (Si), germanium (Ge), gallium arsenide (GaAs), cadmium telluride (CdTe) or alloys thereof. At least one of the layers, such as the conductor layer 607, should be electrically conducting so as to carry charge on to and off of the actuation elements. Candidate materials include, without limitation, Al, Cu, Ni, Cr, Mo, Ti, Ta, Nb, Nd, or alloys thereof or semiconducting materials such as diamond-like carbon, Si, Ge, GaAs, CdTe or alloys thereof. In some implementations employing semiconductor layers, the semiconductors are doped with impurities such as phosphorus (P), arsenic (As), boron (B), or Al. FIG. 6A depicts a sandwich configuration for the composite in which the mechanical layers 605 and 609, having similar thicknesses and mechanical properties, are deposited on either side of the conductor layer 607. In some implementations, the sandwich structure helps to ensure that stresses remaining after deposition and/or stresses that are imposed by temperature variations will not act to cause bending, warping or other deformation of the shutter assembly 600.

In some implementations, the order of the layers in the composite shutter assembly 600 can be inverted, such that the outside of the shutter assembly 600 is formed from a conductor layer while the inside of the shutter assembly 600 is formed from a mechanical layer.

The shutter assembly 600 can include an encapsulating dielectric 611. In some implementations, dielectric coatings can be applied in conformal fashion, such that all exposed bottom, top, and side surfaces of the shutter 601, the anchor 604, and the beams 602 are uniformly coated. Such thin films can be grown by thermal oxidation and/or by conformal CVD of an insulator such as $Al_2O_3$, chromium (III) oxide ($Cr_2O_3$), titanium oxide ($TiO_2$), hafnium oxide ($HfO_2$), vanadium oxide ($V_2O_5$), niobium oxide ($Nb_2O_5$), $Ta_2O_5$, $SiO_2$, or $Si_3N_4$, or by depositing similar materials via atomic layer deposition. The dielectric coating layer can be applied with thicknesses in the range of 10 nm to 1 micron. In some implementations, sputtering and evaporation can be used to deposit the dielectric coating onto sidewalls.

FIGS. 6B-6E show example cross sectional views of the results of certain intermediate manufacturing stages of an example process used to form the shutter assembly 600 depicted in FIG. 6A. In some implementations, the shutter assembly 600 is built on top of a pre-existing control matrix, such as an active matrix array of thin film transistors, such as the control matrices depicted in FIGS. 3A and 3B.

Figure 6B:
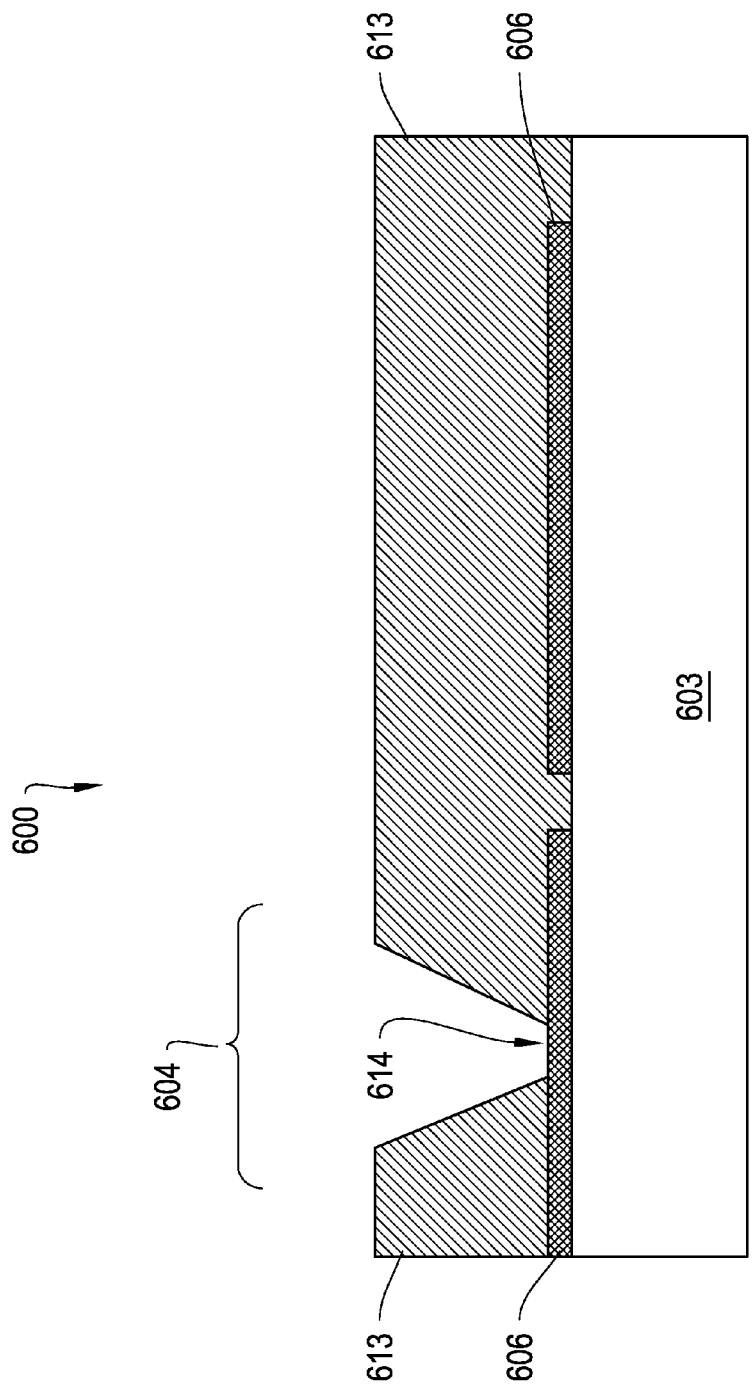

FIG. 6B shows a cross sectional view of the results of a first stage in an example process of forming the shutter assembly 600. As depicted in FIG. 6B, a sacrificial layer 613 is deposited and patterned. In some implementations, polyimide is used as a sacrificial layer material. Other candidate sacrificial layer materials include, without limitation, polymer materials such as polyamide, fluoropolymer, benzocyclobutene, polyphenylquinoxylene, parylene, or polynorbornene. These materials are chosen for their ability to planarize rough surfaces, maintain mechanical integrity at processing temperatures in excess of 250° C., and their ease of etch and/or thermal decomposition during removal. In other implementations, the sacrificial layer 613 is formed from a photoresist, such as polyvinyl acetate, polyvinyl ethylene, and phenolic or novolac resins. An alternate sacrificial layer material used in some implementations is $SiO_2$, which can be removed preferentially as long as other electronic or structural layers are resistant to the hydrofluoric acid solutions used for its removal. One such suitable resistant material is $Si_3N_4$. Another alternate sacrificial layer material is Si, which can be removed preferentially as long as electronic or structural layers are resistant to the fluorine plasmas or xenon difluoride ($XeF_2$) used for its removal, such as most metals and $Si_3N_4$. Yet another alternate sacrificial layer material is Al, which can be removed preferentially as long as other electronic or structural layers are resistant to strong base solutions, such as concentrated sodium hydroxide (NaOH) solutions. Suitable materials include, for example, Cr, Ni, Mo, Ta and Si. Still another alternate sacrificial layer material is Cu, which can be removed preferentially as long as other electronic or structural layers are resistant to nitric or sulfuric acid solutions. Such materials include, for example, Cr, Ni, and Si.

Next the sacrificial layer 613 is patterned to expose holes or vias at the anchor regions 604. In implementations employing polyimide or other non-photoactive materials as the sacrificial layer material, the sacrificial layer material can be formulated to include photoactive agents, allowing regions exposed through a UV photomask to be preferentially removed in a developer solution. Sacrificial layers formed from other materials can be patterned by coating the sacrificial layer 613 in an additional layer of photoresist, photopatterning the photoresist, and finally using the photoresist as an etching mask. The sacrificial layer 613 alternatively can be patterned by coating the sacrificial layer 613 with a hard mask, which can be a thin layer of $SiO_2$ or a metal such as Cr. A photopattern is then transferred to the hard mask by way of photoresist and wet chemical etching. The pattern developed in the hard mask can be resistant to dry chemical, anisotropic, or plasma etching—techniques which can be used to impart deep and narrow anchor holes into the sacrificial layer 613.

After the anchor regions 604 have been opened in the sacrificial layer 613, the exposed and underlying conducting surface 614 can be etched, either chemically or via the sputtering effects of a plasma, to remove any surface oxide layers. Such a contact etching stage can improve the ohmic contact between the underlying conducting surface 614 and the shutter material. After patterning of the sacrificial layer 613, any photoresist layers or hard masks can be removed through use of either solvent cleaning or acid etching.

Figure 6C:
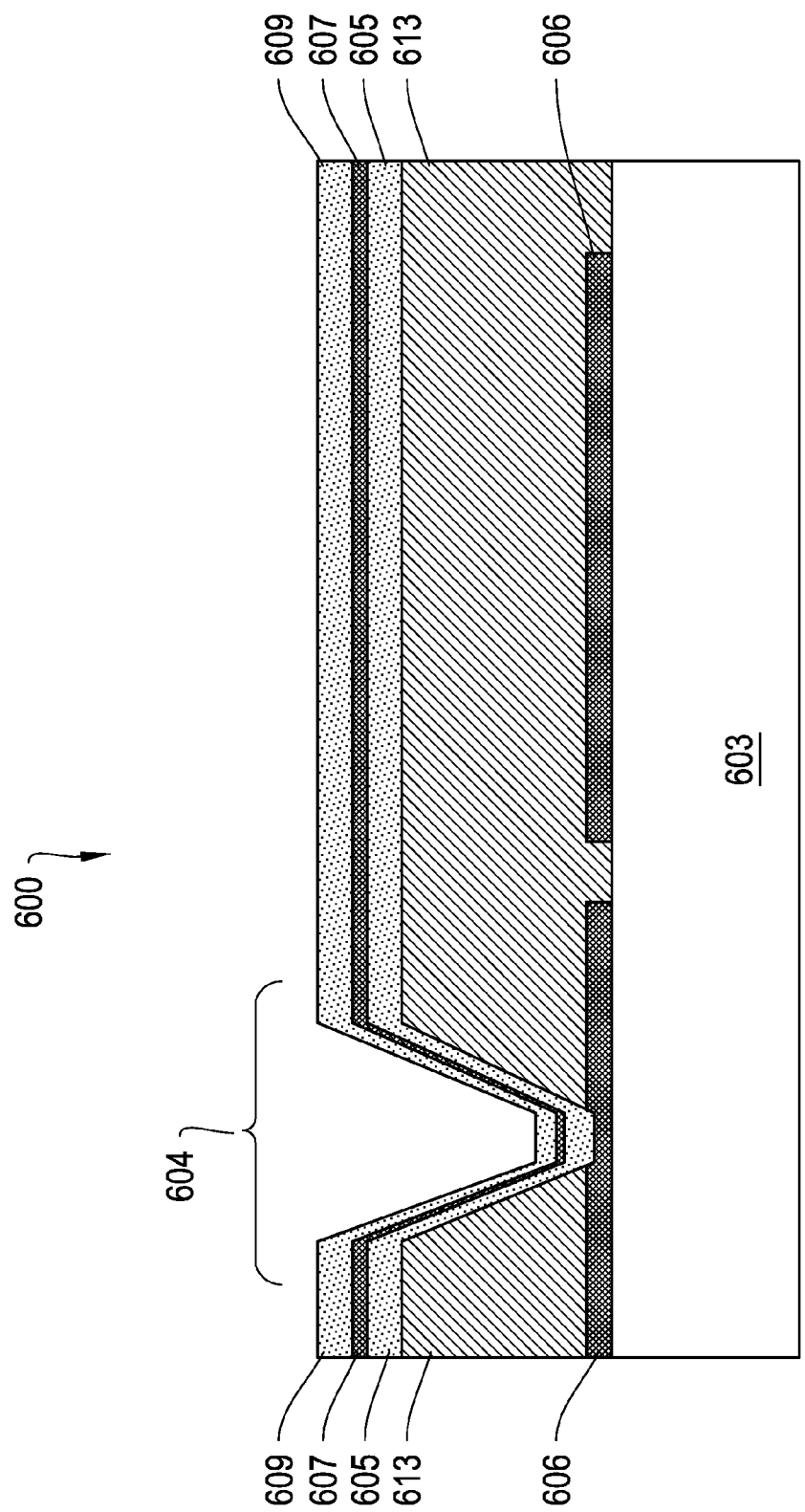

Next, in the process for building the shutter assembly 600, as depicted in FIG. 6C, the shutter materials are deposited. The shutter assembly 600 is composed of multiple thin films: the first mechanical layer 605, the conductor layer 607 and the second mechanical layer 609. In some implementations, the first mechanical layer 605 is an amorphous silicon (a-Si) layer, the conductor layer 607 is Al and the second mechanical layer 609 is a-Si. The first mechanical layer 605, the conductor layer 607, and the second mechanical layer 609 are deposited at a temperature which is below that at which physical degradation occurs for the sacrificial layer 613. For instance, polyimide decomposes at temperatures above about 400° C. Therefore, in some implementations, the first mechanical layer 605, the conductor layer 607 and the second mechanical layer 609 are deposited at temperatures below about 400° C., allowing usage of polyimide as a sacrificial layer material. In some implementations, hydrogenated amorphous silicon (a-Si:H) is a useful mechanical material for the first and second mechanical layers 605 and 609 since it can be grown to thicknesses in the range of about 0.15 to about 3 microns, in a relatively stress-free state, by way of plasma-enhanced chemical vapor deposition (PECVD) from silane gas at temperatures in the range of about 250 to about 350° C. In some of such implementations, phosphine gas ($PH_3$) is used as a dopant so that the a-Si can be grown with resistivities below about 1 ohm-cm. In alternate implementations, a similar PECVD technique can be used for the deposition of $Si_3N_4$, silicon-rich $Si_3N_4$, or $SiO_2$ materials as the first mechanical layer 605 or for the deposition of diamond-like carbon, Ge, SiGe, CdTe, or other semiconducting materials for the first mechanical layer 605. An advantage of the PECVD deposition technique is that the deposition can be quite conformal, that is, it can coat a variety of inclined surfaces or the inside surfaces of narrow via holes. Even if the anchor or via holes which are cut into the sacrificial layer material present nearly vertical sidewalls, the PECVD technique can provide a substantially continuous coating between the bottom and top horizontal surfaces of the anchor.

In addition to the PECVD technique, alternate suitable techniques available for the growth of the first and second mechanical layers 605 and 609 include RF or DC sputtering, metal-organic CVD, evaporation, electroplating or electroless plating.

For the conductor layer 607, in some implementations, a metal thin film, such as Al, is utilized. In some other implementations, alternative metals, such as Cu, Ni, Mo, or Ta can be chosen. The inclusion of such a conducting material serves two purposes. It reduces the overall sheet resistance of the shutter 601, and it helps to block the passage of visible light through the shutter 601, since a-Si, if less than about 2 microns thick, as may be used in some implementations of the shutter 601, can transmit visible light to some degree. The conducting material can be deposited either by sputtering or, in a more conformal fashion, by CVD techniques, electroplating, or electroless plating.

Figure 6D:
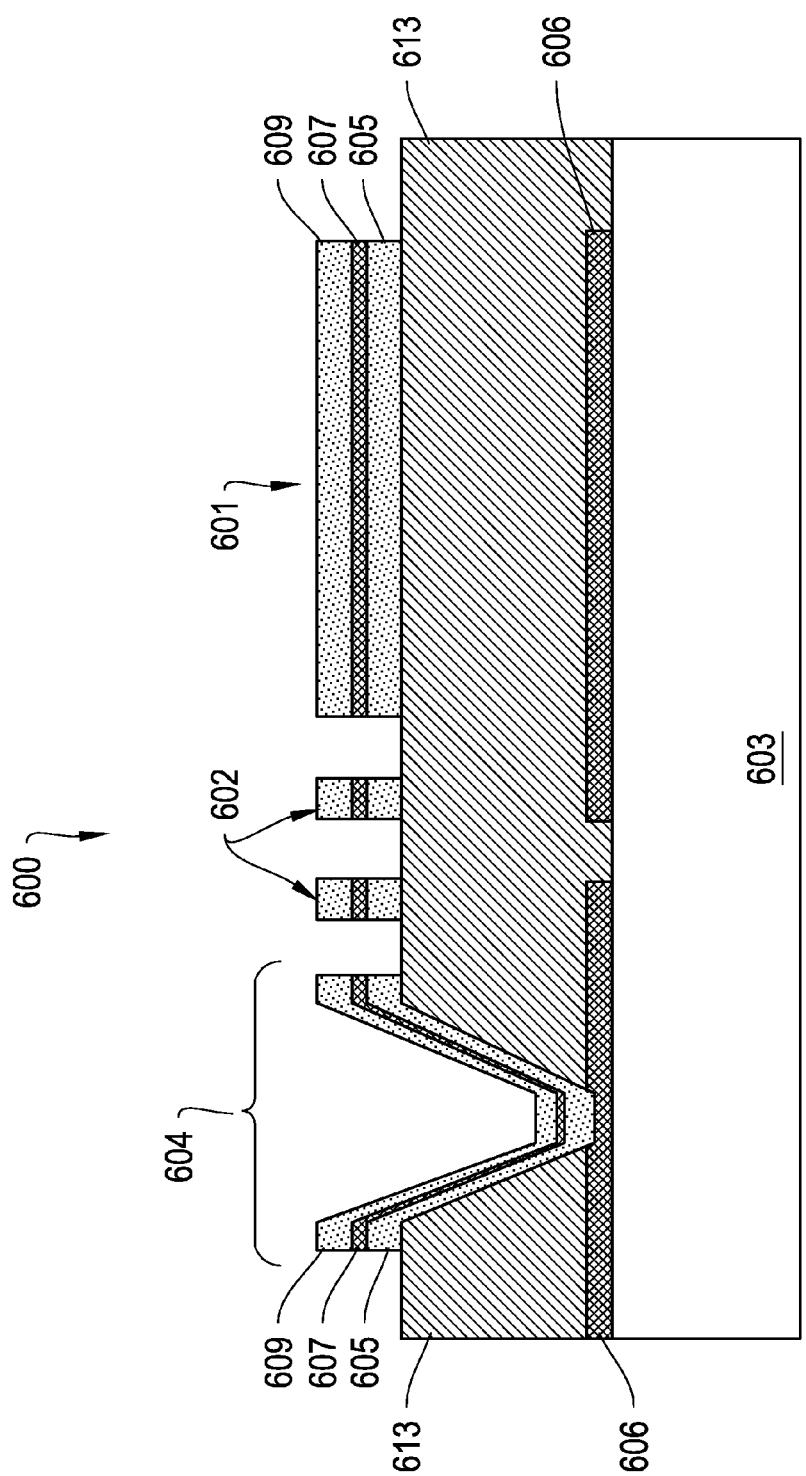

FIG. 6D shows the results of the next set of processing stages used in the formation of the shutter assembly 600. The first mechanical layer 605, the conductor layer 607, and the second mechanical layer 609 are photomasked and etched while the sacrificial layer 613 is still on the substrate 603. First, a photoresist material is applied, then exposed through a photomask, and then developed to form an etch mask. Amorphous silicon, $Si_3N_4$, and $SiO_2$ can then be etched in fluorine-based plasma chemistries. $SiO_2$ mechanical layers also can be etched using HF wet chemicals; and any metals in the conductor layer 607 can be etched with either wet chemicals or chlorine-based plasma chemistries.

The pattern shapes applied through the photomask can influence the mechanical properties, such as stiffness, compliance, and the voltage response in the actuator and shutter 601 of the shutter assembly 600. The shutter assembly 600 includes the compliant beams 602, shown in cross section. Each compliant beam 602 is shaped such that the width is less than the total height or thickness of the shutter material. In some implementations, the beam dimensional ratio is maintained at about 1.4:1 or greater, with the compliant beams 602 being taller or thicker than they are wide.

Figure 6E:
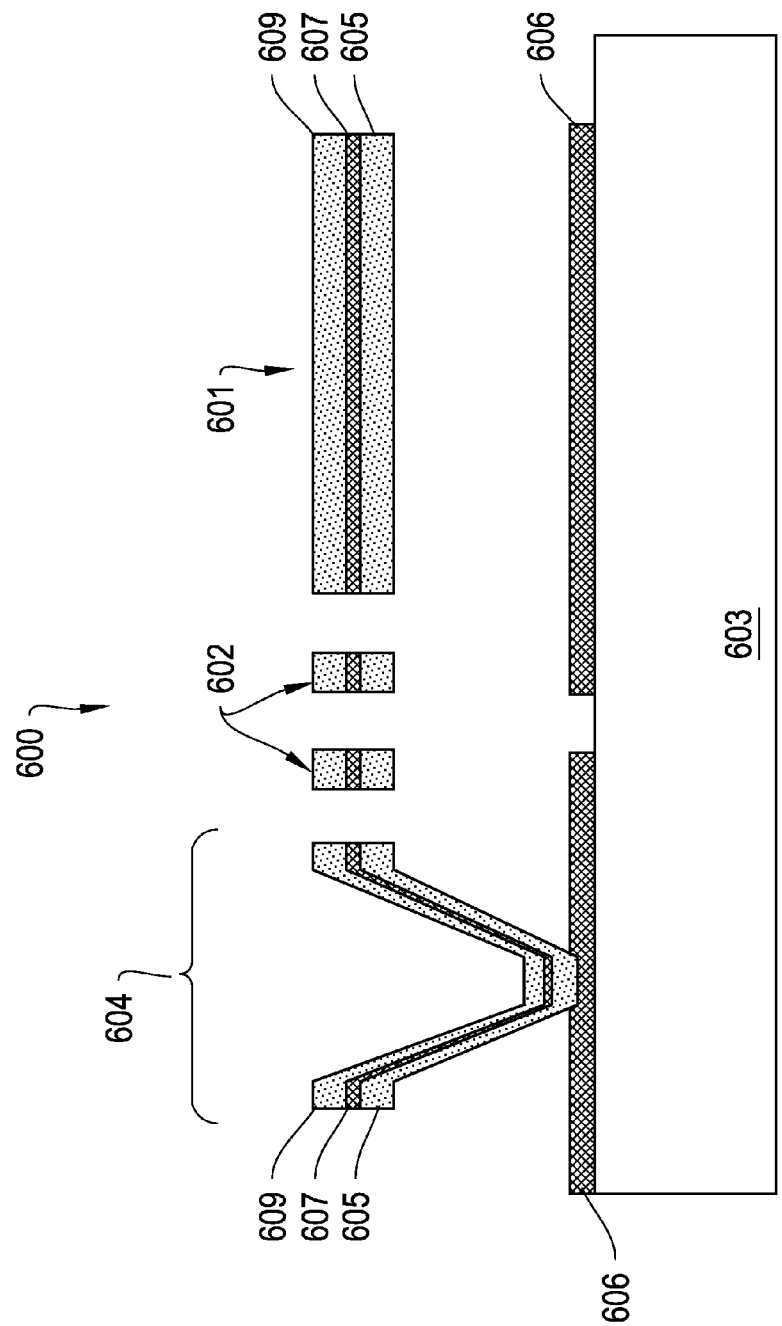

The results of subsequent stages of the example manufacturing process for building the shutter assembly 600 are depicted in FIG. 6E. The sacrificial layer 613 is removed, which frees-up all moving parts from the substrate 603, except at the anchor points. In some implementations, polyimide sacrificial materials are removed in an oxygen plasma. Other polymer materials used for the sacrificial layer 613 also can be removed in an oxygen plasma, or in some cases by thermal pyrolysis. Some sacrificial layer materials (such as $SiO_2$) can be removed by wet chemical etching or by vapor phase etching.

In a final process, the results of which are depicted in FIG. 6A, the encapsulating dielectric 611 is deposited on all exposed surfaces of the shutter assembly 600. In some implementations, the encapsulating dielectric 611 can be applied in a conformal fashion, such that all bottom, top, and side surfaces of the shutter 601 and the beams 602 are uniformly coated using CVD. In some other implementations, only the top and side surfaces of the shutter 601 are coated. In some implementations, $Al_2O_3$ is used for the encapsulating dielectric 611 and is deposited by atomic layer deposition to thicknesses in the range of about 10 to about 100 nanometers.

Finally, anti-stiction coatings can be applied to the surfaces of the shutter 601 and the beams 602. These coatings prevent the unwanted stickiness or adhesion between two independent beams of an actuator. Suitable coatings include carbon films (both graphite and diamond-like) as well as fluoropolymers, and/or low vapor pressure lubricants, as well as chlorosilanes, hydrocarbon chlorosilanes, fluorocarbon chlorosilanes, such as methoxy-terminated silanes, perfluoronated, amino-silanes, siloxanes and carboxylic acid based monomers and species. These coatings can be applied by either exposure to a molecular vapor or by decomposition of precursor compounds by way of CVD. Anti-stiction coatings also can be created by the chemical alteration of shutter surfaces, such as by fluoridation, silanization, siloxidation, or hydrogenation of insulating surfaces.

One class of suitable actuators for use in MEMS-based shutter displays include compliant actuator beams for controlling shutter motion that is transverse to or in-the-plane of the display substrate. The voltage employed for the actuation of such shutter assemblies decreases as the actuator beams become more compliant. The control of actuated motion also improves if the beams are shaped such that in-plane motion is preferred or promoted with respect to out-of-plane motion. Thus, in some implementations, the compliant actuator beams have a rectangular cross section, such that the beams are taller or thicker than they are wide.

The stiffness of a long rectangular beam with respect to bending within a particular plane scales with the thinnest dimension of that beam in that plane to the third power. It is therefore advantageous to reduce the width of the compliant beams to reduce the actuation voltages for in-plane motion. When using conventional photolithography equipment to define and fabricate the shutter and actuator structures, however, the minimum width of the beams can be limited to the resolution of the optics. And although photolithography equipment has been developed for defining patterns in photoresist with narrow features, such equipment is expensive, and the areas over which patterning can be accomplished in a single exposure are limited. For economical photolithography over large panels of glass or other transparent substrates, the patterning resolution or minimum feature size is typically limited to several microns.

FIGS. 7A-7D show isometric views of stages of construction of an example shutter assembly 700 with narrow sidewall beams. This alternate process yields compliant actuator beams 718 and 720 and a compliant spring beam 716 (collectively referred to as "sidewall beams 716, 718 and 720"), which have a width well below the conventional lithography limits on large glass panels. In the process depicted in FIGS. 7A-7D, the compliant beams of shutter assembly 700 are formed as sidewall features on a mold made from a sacrificial material. The process is referred to as a sidewall beams process.

Figure 7A:
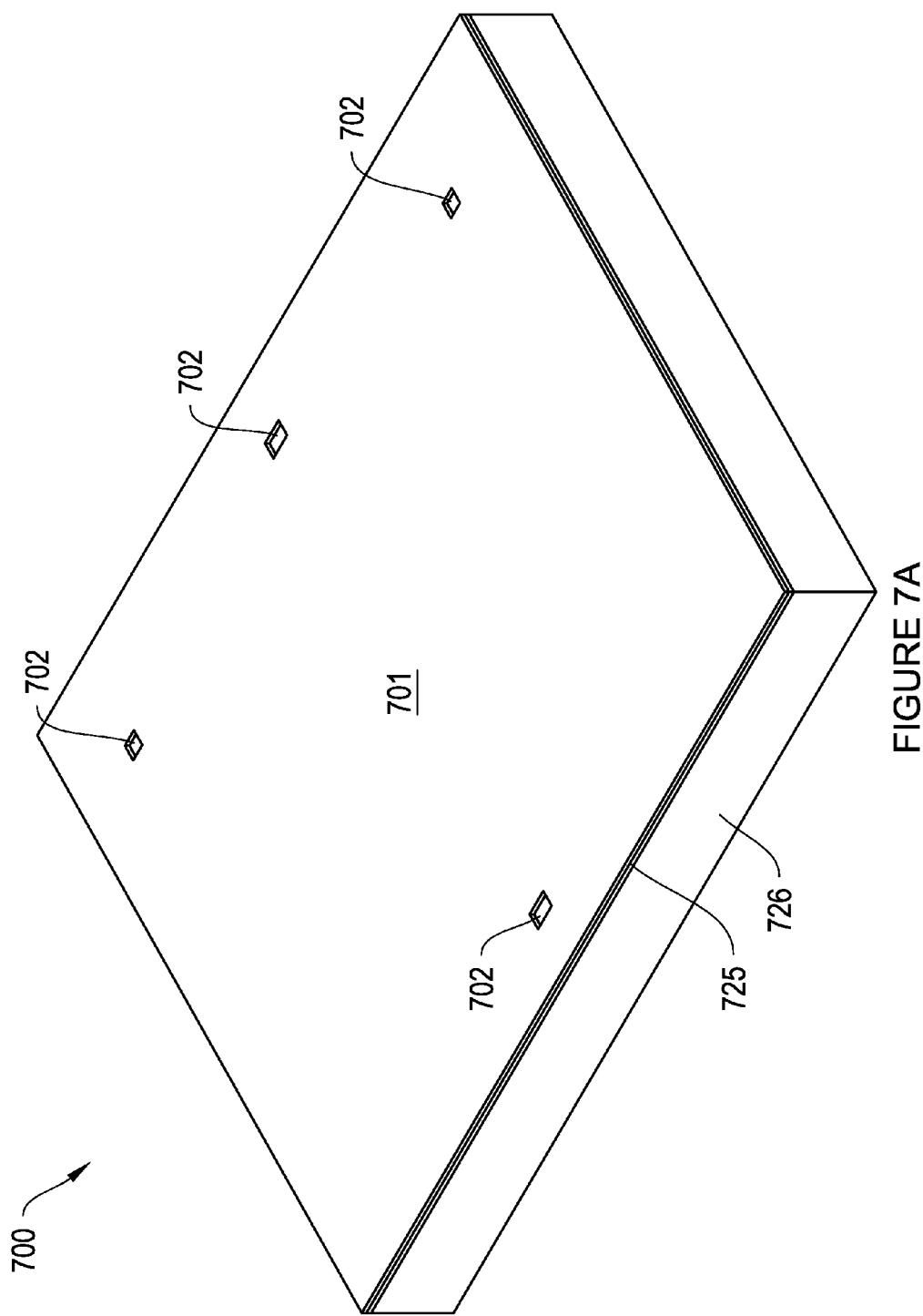
FIGS. 7A-7D show isomeric views of stages of construction of an example shutter assembly with narrow sidewall beams.

The process of forming the shutter assembly 700 with the sidewall beams 716, 718 and 720 begins, as depicted in FIG. 7A, with the deposition and patterning of a first sacrificial material 701. The pattern defined in the first sacrificial material 701 creates openings or vias 702 within which anchors for the shutter assembly 700 eventually will be formed. The deposition and patterning of the first sacrificial material 701 is similar in concept, and uses similar materials and techniques, as those described for the deposition and patterning described in relation to FIGS. 6A-6E.

Figure 7B:
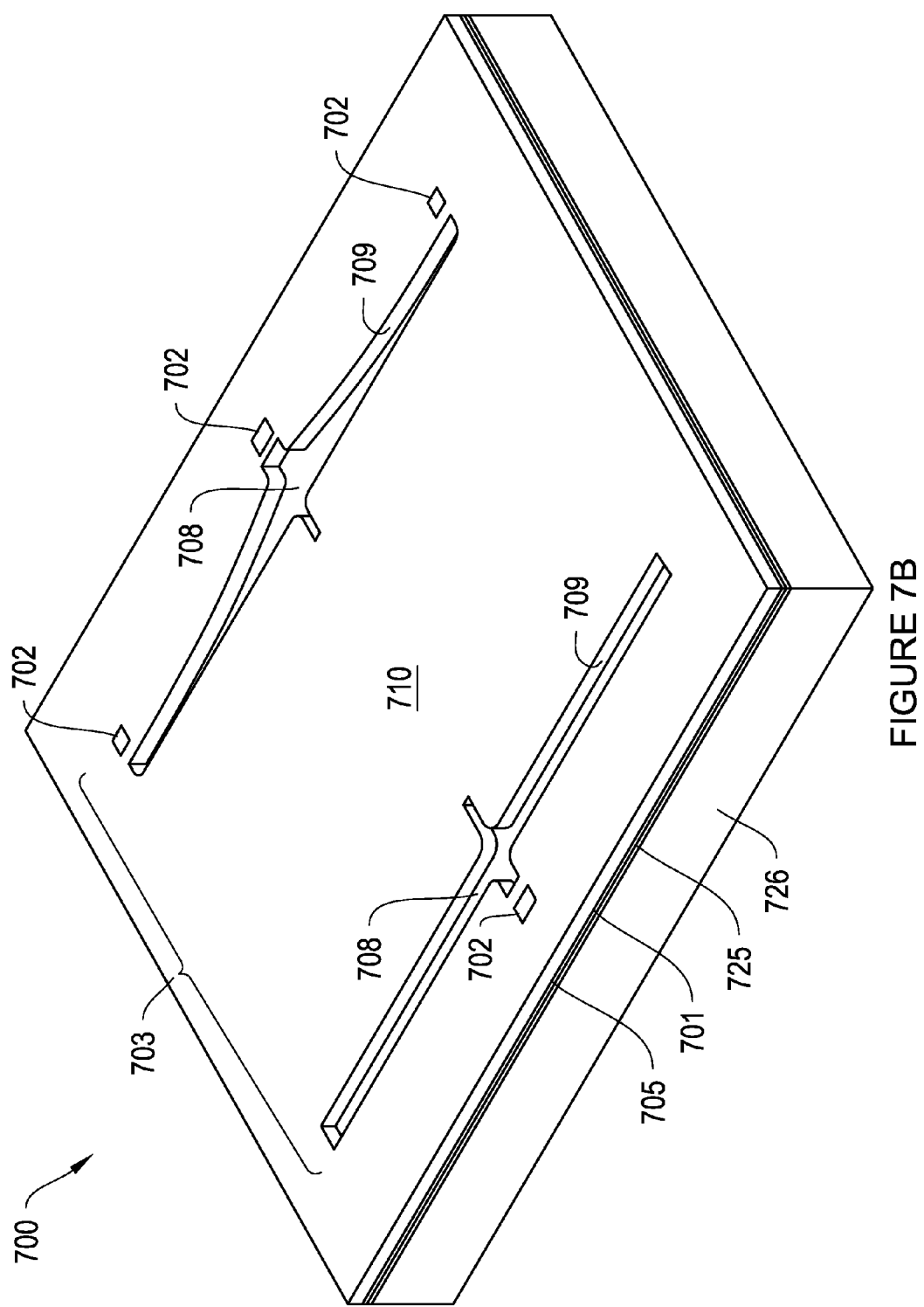

The process of forming the sidewall beams 716, 718 and 720 continues with the deposition and patterning of a second sacrificial material 705. FIG. 7B shows the shape of a mold 703 that is created after patterning of the second sacrificial material 705. The mold 703 also includes the first sacrificial material 701 with its previously defined vias 702. The mold 703 in FIG. 7B includes two distinct horizontal levels. The bottom horizontal level 708 of the mold 703 is established by the top surface of the first sacrificial layer 701 and is accessible in those areas where the second sacrificial material 705 has been etched away. The top horizontal level 710 of the mold 703 is established by the top surface of the second sacrificial material 705. The mold 703 depicted in FIG. 7B also includes substantially vertical sidewalls 709. Materials for use as the first and second sacrificial materials 701 and 705 are described above with respect to the sacrificial layer 613 of FIGS. 6A-6E.

Figure 7C:
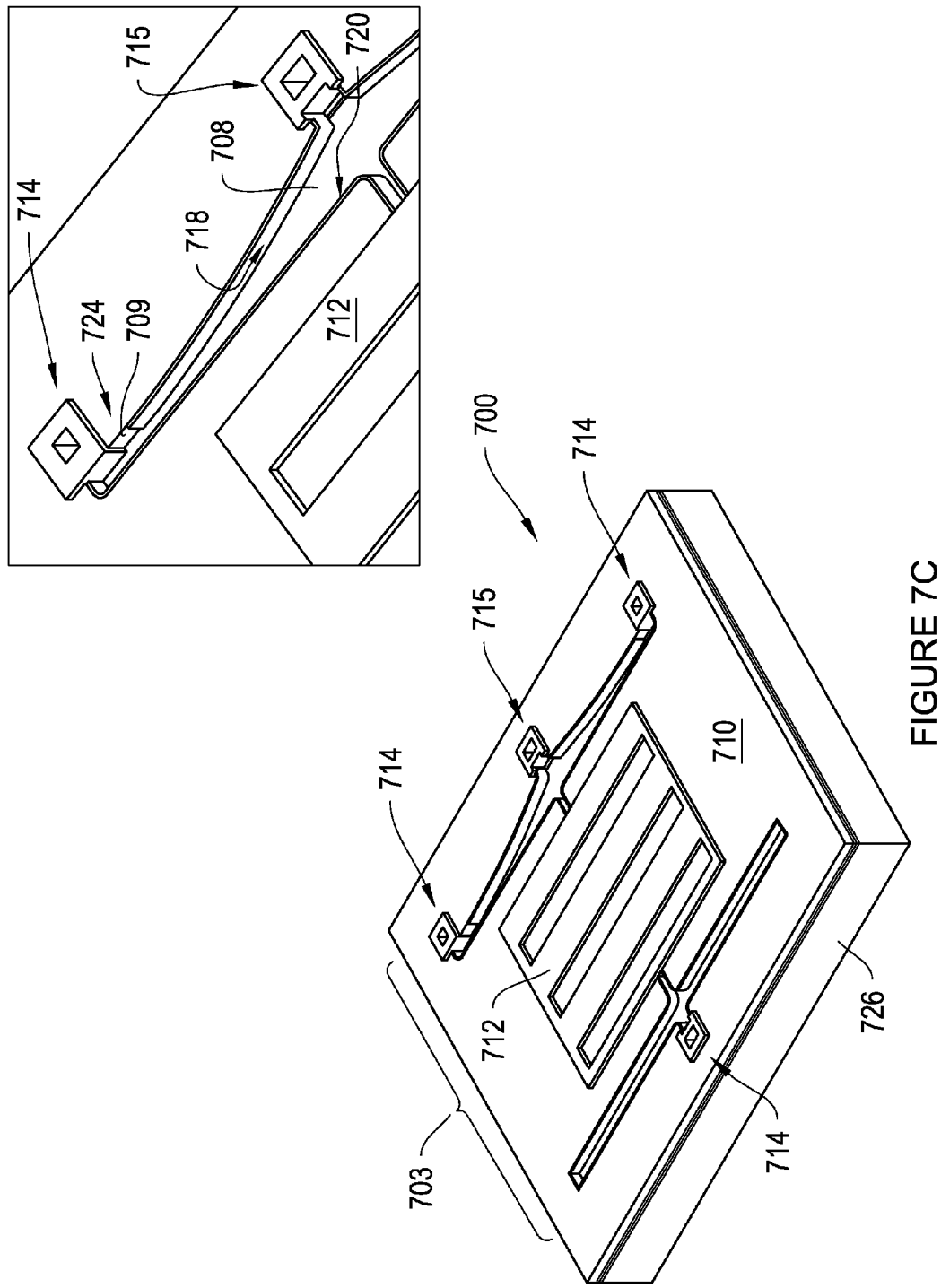

The process of forming the sidewall beams 716, 718 and 720 continues with the deposition and patterning of shutter material onto all of the exposed surfaces of the sacrificial mold 703, as depicted in FIG. 7C. Suitable materials for use in forming the shutter 712 are described above with respect to the first mechanical layer 605, the conductor layer 607, and the second mechanical layer 609 of FIGS. 6A-6E. The shutter material is deposited to a thickness of less than about 2 microns. In some implementations, the shutter material is deposited to have a thickness of less than about 1.5 microns. In some other implementations, the shutter material is deposited to have a thickness of less than about 1.0 microns, and as thin as about 0.10 microns. After deposition, the shutter material (which may be a composite of several materials as described above) is patterned, as depicted in FIG. 7C. First, a photoresist is deposited on the shutter material. The photoresist is then patterned. The pattern developed into the photoresist is designed such that the shutter material, after a subsequent etch stage, remains in the region of the shutter 712 as well as at the anchors 714.

The manufacturing process continues with applying an anisotropic etch, resulting in the structure depicted in FIG. 7C. The anisotropic etch of the shutter material is carried out in a plasma atmosphere with a voltage bias applied to the substrate 726 or to an electrode in proximity to the substrate 726. The biased substrate 726 (with electric field perpendicular to the surface of the substrate 726) leads to acceleration of ions toward the substrate 726 at an angle nearly perpendicular to the substrate 726. Such accelerated ions, coupled with the etching chemicals, lead to etch rates that are much faster in a direction that is normal to the plane of the substrate 726 as compared to directions parallel to the substrate 726. Undercut-etching of shutter material in the regions protected by a photoresist is thereby substantially eliminated. Along the vertical sidewalls 709 of the mold 703, which are substantially parallel to the track of the accelerated ions, the shutter material also is substantially protected from the anisotropic etch. Such protected sidewall shutter material form the sidewall beams 716, 718, and 720 for supporting the shutter 712. Along other (non-photoresist-protected) horizontal surfaces of the mold 703, such as the top horizontal surface 710 or the bottom horizontal surface 708, the shutter material has been substantially completely removed by the etch.

The anisotropic etch used to form the sidewall beams 716, 718 and 720 can be achieved in either an RF or DC plasma etching device as long as provision for electrical bias of the substrate 726 or of an electrode in close proximity of the substrate 726 is supplied. For the case of RF plasma etching, an equivalent self-bias can be obtained by disconnecting the substrate holder from the grounding plates of the excitation circuit, thereby allowing the substrate potential to float in the plasma. In some implementations, it is possible to provide an etching gas such as trifluoromethane ($CHF_3$), perfluorobutene ($C_4F_8$), or chloroform ($CHCl_3$) in which both carbon and hydrogen and/or carbon and fluorine are constituents in the etch gas. When coupled with a directional plasma, achieved again through voltage biasing of the substrate 726, the liberated carbon (C), hydrogen (H), and/or fluorine (F) atoms can migrate to the vertical sidewalls 709 where they build up a passive or protective quasi-polymer coating. This quasi-polymer coating further protects the sidewall beams 716, 718 and 720 from etching or chemical attack.

Figure 7D:
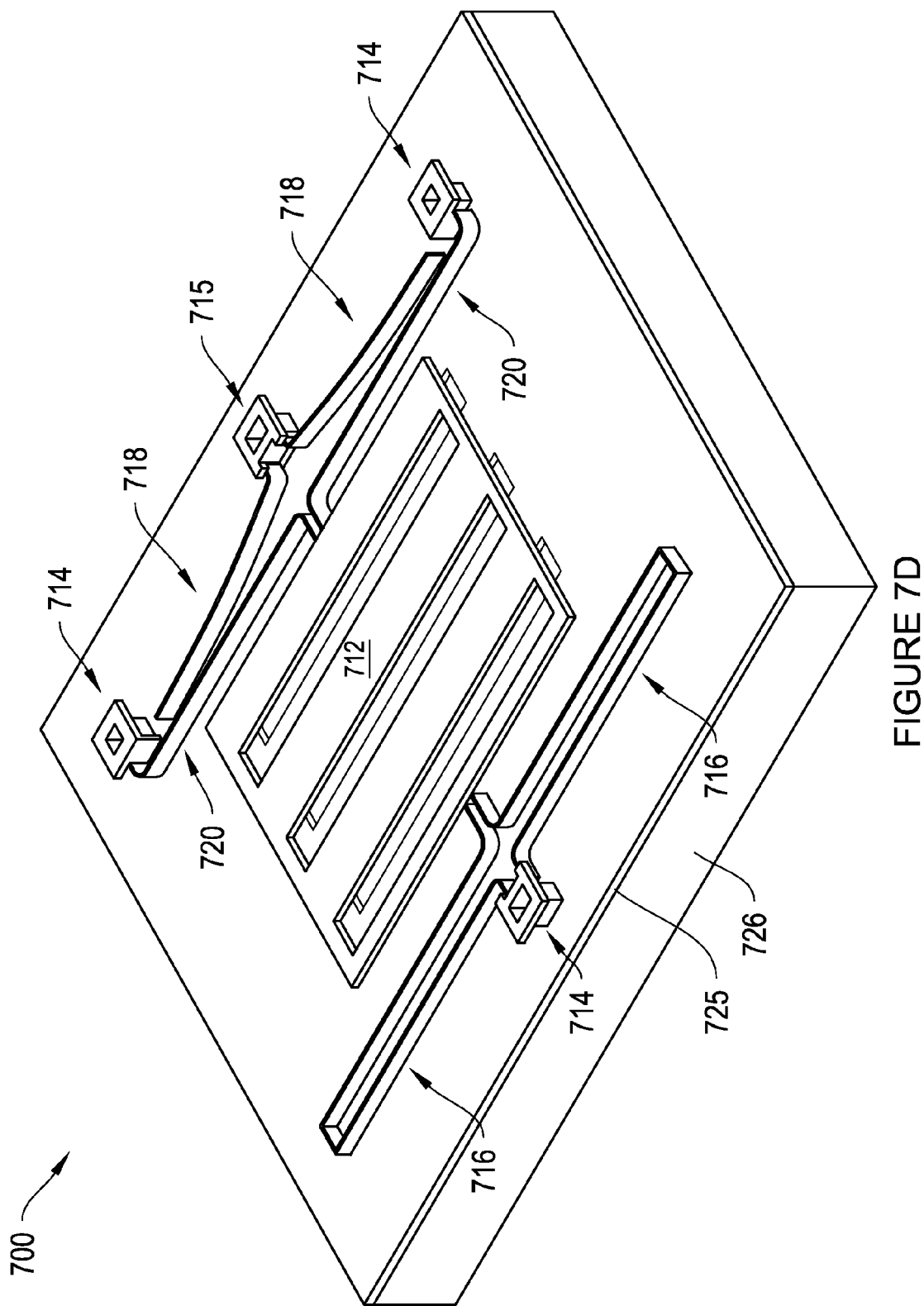

The process of forming the sidewall beams 716, 718 and 720 includes the removal of the remainder of the second sacrificial material 705 and the first sacrificial material 701. The result is shown in FIG. 7D. The process of removing sacrificial material is similar to that described with respect to FIG. 6E. The material deposited on the vertical sidewalls 709 of the mold 703 remain as the sidewall beams 716, 718 and 720. The sidewall beam 716 serves as a spring mechanically connecting the anchors 714 to the shutter 712, and also provides a passive restoring force and to counter the forces applied by the actuator formed from the compliant beams 718 and 720. The anchors 714 connect to an aperture layer 725.

The sidewall beams 716, 718 and 720 are tall and narrow. The width of the sidewall beams 716, 718 and 720, as formed from the surface of the mold 703, is similar to the thickness of the shutter material as deposited. In some implementations, the width of sidewall beam 716 will be the same as the thickness of shutter 712. In some other implementations, the beam width will be about ½ the thickness of the shutter 712. The height of the sidewall beams 716, 718 and 720 is determined by the thickness of the second sacrificial material 705, or in other words, by the depth of the mold 703, as created during the patterning operation described in relation to FIG. 7B. As long as the thickness of the deposited shutter material is chosen to be less than about 2 microns, the process depicted in FIGS. 7A-7D is well suited for the production of narrow beams. In fact, for many applications the thickness range of 0.1 to 2.0 micron is quite suitable. Conventional photolithography would limit the patterned features shown in FIGS. 7A, 7B and 7C to much larger dimensions, for instance allowing minimum resolved features no smaller than 2 microns or 5 microns.

FIG. 7D depicts an isomeric view of the shutter assembly 700, formed after the release operation in the above-described process, yielding compliant beams with cross sections of high aspect ratios. As long as the thickness of the second sacrificial material 705 is, for example, greater than about 4 times larger than the thickness of the shutter material, the resulting ratio of beam height to beam width will be produced to a similar ratio, i.e., greater than about 4:1.

An optional stage, not illustrated above but included as part of the process leading to FIG. 7C, involves isotropic etching of the sidewall beam material to separate or decouple the compliant load beams 720 from the compliant drive beams 718. For instance, the shutter material at point 724 has been removed from the sidewall through use of an isotropic etch. An isotropic etch is one whose etch rate is substantially the same in all directions, so that sidewall material in regions such as point 724 is no longer protected. The isotropic etch can be accomplished in the typical plasma etch equipment as long as a bias voltage is not applied to the substrate 726. An isotropic etch also can be achieved using wet chemical or vapor phase etching techniques. Prior to this optional fourth masking and etch stage, the sidewall beam material exists essentially continuously around the perimeter of the recessed features in the mold 703. The fourth mask and etch stage is used to separate and divide the sidewall material, forming the distinct beams 718 and 720. The separation of the beams 718 and 720 at point 724 is achieved through a fourth process of photoresist dispense, and exposure through a mask. The photoresist pattern in this case is designed to protect the sidewall beam material against isotropic etching at all points except at the separation point 724.

As a final stage in the sidewall process, an encapsulating dielectric is deposited around the outside surfaces of the sidewall beams 716, 718 and 720.

In order to protect the shutter material deposited on the vertical sidewalls 709 of the mold 703 and to produce the sidewall beams 716, 718 and 720 of substantially uniform cross section, some particular process guidelines can be followed. For instance, in FIG. 7B, the sidewalls 709 can be made as vertical as possible. Slopes at the vertical sidewalls 709 and/or exposed surfaces become susceptible to the anisotropic etch. In some implementations, the vertical sidewalls 709 can be produced by the patterning operation at FIG. 7B, such as the patterning of the second sacrificial material 705 in an anisotropic fashion. The use of an additional photoresist coating or a hard mask in conjunction with patterning of the second sacrificial layer 705 allows the use of aggressive plasmas and/or high substrate bias in the anisotropic etch of the second sacrificial material 705 while mitigating against excessive wear of the photoresist. The vertical sidewalls 709 also can be produced in photoimageable sacrificial materials as long as care is taken to control the depth of focus during the UV exposure and excessive shrinkage is avoided during final cure of the resist.

Another process guideline that helps during sidewall beam processing relates to the conformality of the shutter material deposition. The surfaces of the mold 703 can be covered with similar thicknesses of the shutter material, regardless of the orientation of those surfaces, either vertical or horizontal. Such conformality can be achieved when depositing with CVD. In particular, the following conformal techniques can be employed: PECVD, low pressure chemical vapor deposition (LPCVD), and atomic or self-limited layer deposition (ALD). In the above CVD techniques the growth rate of the thin film can be limited by reaction rates on a surface as opposed to exposing the surface to a directional flux of source atoms. In some implementations, the thickness of material grown on vertical surfaces is at least 50% of the thickness of material grown on horizontal surfaces. Alternatively, shutter materials can be conformally deposited from solution by electroless plating or electroplating, after a metal seed layer is provided that coats the surfaces before plating.

Figure 8:
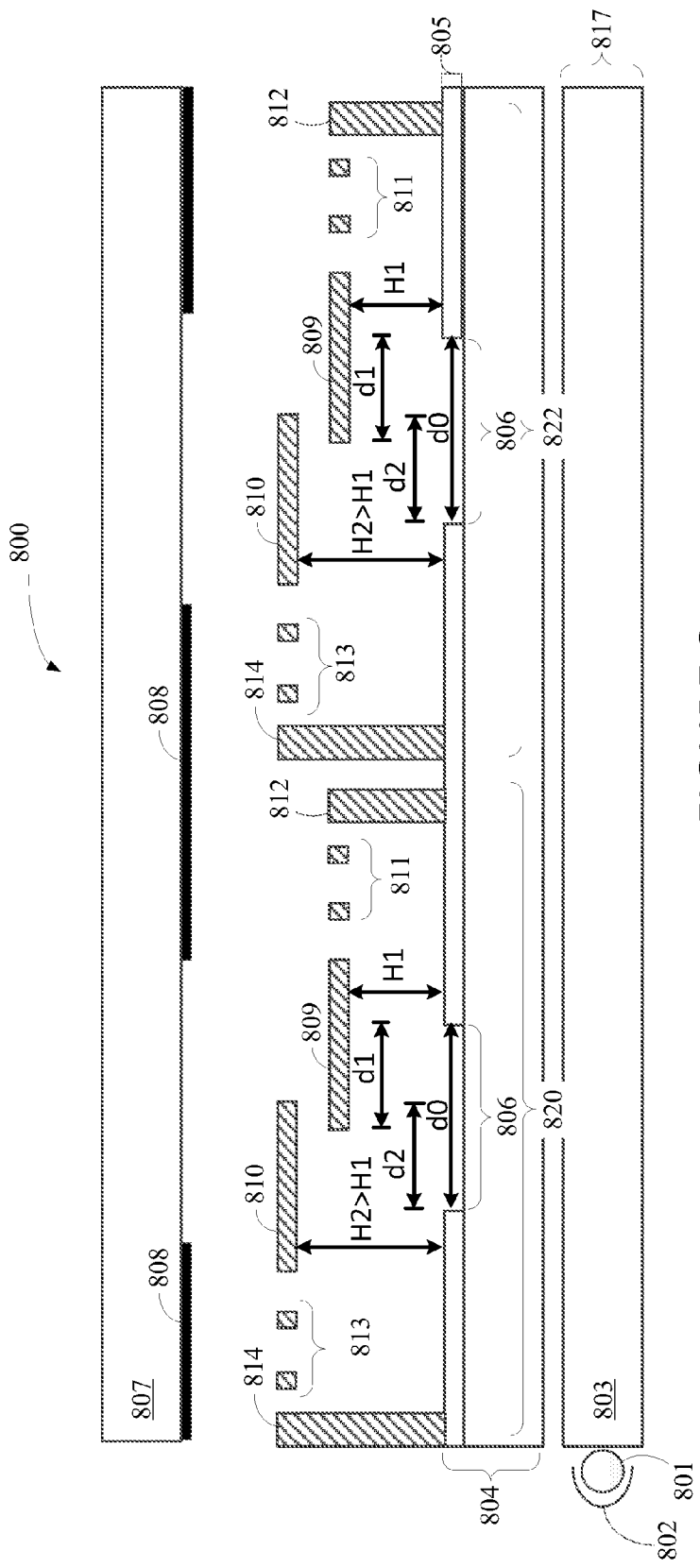
FIG. 8 shows a cross sectional view of an example display apparatus with multi-level shutters.

FIG. 8 shows a cross sectional view of an example display apparatus 800 with multi-level shutters. In particular, FIG. 8 shows shutter assemblies 820 and 822 having multi-level shutters. As described in detail below, employing multi-level shutters, each having a two-state operation, can allow the shutter assemblies 820 and 822 to achieve more than two states (hereinafter referred to a "multi-state"). The display apparatus 800 includes a backlight 817, which, in turn, includes a light source 801, a reflector 802, and a light guide 803. The display apparatus 800 also includes a transparent substrate 804 over which an aperture layer 805 is formed. The aperture layer 805 includes a number of openings or apertures; two of such apertures 806 are shown in FIG. 8. The aperture layer 805 absorbs light impinging on its front-facing surface and reflects light impinging on its rear-facing surface back towards the backlight 817. However, light incident at the aperture 806 passes through the aperture layer 805 towards the front of the display apparatus 800. The front of the display apparatus 800 includes a transparent cover plate 807. The rear facing surface of the cover plate 807 can be covered with a light blocking material 808. The light blocking material includes front apertures for allowing light propagating through the shutter assemblies 820 and 822 to pass towards the front of the display apparatus 800. The light blocking layer 808 also absorbs ambient light incident on the cover plate 807, thereby increasing the contrast ratio of the display apparatus 800.

In general, the display apparatus 800 of FIG. 8 is similar to the display apparatus 500 of FIG. 5, in that the light source 801, the reflector 802, the light guide 803, the substrate 804, the aperture layer 805, the cover plate 807, and the light blocking material 808 are similar in construction and function to the light source 518, the reflector 519, the light guide 516, the substrate 504, the aperture layer 506, the cover plate 522, and the light blocking material 524, respectively, of the display apparatus 500. However, while the shutter assemblies 502 of the display apparatus 500 of FIG. 5 shows only one shutter associated with an aperture (such as shutter 503 associated with aperture 508), the shutter assemblies 820 and 822 of the display apparatus 800 shows multiple shutters associated with a single aperture 806.

In particular, each of the shutter assemblies 820 and 822 of the display apparatus 800 includes two shutters: a first shutter 809 and a second shutter 810 associated with the same aperture 806. The first shutter 809 and the second shutter 810, alone or in combination, contribute to the modulation of the light passing through the apertures 806 towards the front of the display apparatus 800. Each first shutter 809 is supported by a portion of a first actuator 811 and a first anchor 812 at a height H1 from the aperture layer 805. Each second shutter 810 is supported by a portion of a second actuator 813 and a second anchor 814 at a height of H2 from the aperture layer 805. The height H2 can be greater than the height H1. That is, the second shutters 810 can be situated at a larger distance from the aperture layer 805 than the first shutters 809. As a person having ordinary skill in the art will readily understand, in alternative implementations, the first shutters 809 can be situated at a larger distance from the aperture layer 805 than the second shutters 810. For example, the height H1 can be about 2-6 microns, while the height H2 can be about 5-10 microns. Additional anchors and actuators also may support each of the first shutters 809 and second shutters 810

The first shutters 809 and the second shutters 810 can each operate between two states: an open state and a closed state. In their respective open states, the first shutters 809 and the second shutters 810 each allow portions of the light propagating through the apertures 806 to pass towards the front of the display apparatus 800. In other words, light originating from the backlight 803 is allowed to pass through the aperture 806, then through the front aperture formed by the light blocking layer 808, and towards the front of the display apparatus 800. In their respective closed states, the first shutters 809 and the second shutters 810 each partially obstruct the apertures 806, partially blocking light propagating through the apertures 806 towards the front of the display apparatus 800.

The degree to which each of the first shutters 809 and the second shutters 810 blocks light in their respective closed states is a function, in part, of the extent to which each of the first 809 and second 810 shutters obstructs the apertures 806 and the respective shapes of the first shutters 809, the second shutters 810 and the apertures 806.

In some implementations, such as the one shown in FIG. 8, the apertures 806, the first shutters 809 and the second shutters 810 are all rectangular in shape. In some other implementations, the first shutters 809 and the second shutters 810 can have shapes that are not rectangular. For example, the shutters can be square, zigzagged, curved, etc. In some other implementations, the first shutters 809 and the second shutters 810 can have dissimilar shapes, sizes, lengths or widths.

The cross section of the display apparatus 800 in FIG. 8 shows the width of the apertures 806 having a dimension d0. For example, d0 can be about 10-30 micrometers (microns). FIG. 8 also shows that in their closed states, the first shutters 809 extend over the width of the apertures 806 by a distance of d1, and the second shutters 810 extends over the width of the apertures 806 by a distance of d2. The sum of d1 and d2 is at least equal to or greater than d0. For example, d1 and d2 can each be about 5-15 microns. As will be further described below, configuring the shutters to partially allow light to pass when one, but not the other, of a first shutter 809 and a second shutter 810 is in the closed state allows the shutter assemblies 820 and 822 to operate in intermediate, partially transmissive states.

The shutter assemblies 820 and 822 can operate in two-state or multi-state modes. In the two-state mode, the shutter assemblies 820 and 822 are each switched between two states: fully transmissive and fully obstructive. In the fully transmissive state, the shutter assemblies 820 and 822 allow the light propagating through the aperture 806 to pass towards the front of the display apparatus 800 substantially unobstructed. In the fully obstructive state, the shutter assemblies 820 and 822 obstruct substantially all of the light propagating through the aperture 806. In the multi-state mode, the display apparatus 800 provides the shutter assemblies 820 and 822 with two additional partially transmissive states.

FIGS. 9A-9D show various example top views of states of the multi-level shutters of the display apparatus 800 of FIG. 8. In particular, FIGS. 9A and 9B show the two states which the shutter assembly 820 can enter in either the two-state mode or the multi-state mode. FIGS. 9C and 9D show two additional states the shutter assembly 820 can enter if operating in the multi-state mode.

As discussed above, in the two-state mode, the shutter assembly 820 can transition between a fully transmissive state and a fully obstructive state. FIG. 9A shows the fully transmissive state, in which both the first shutter 809 and the second shutter 810 are in an open state. As both the first and the second shutters 809 and 810 are in the open state, substantially all of the light propagating from the backlight through the aperture 806 is allowed to pass.

In contrast, in the fully obstructive state, the shutter assembly 820 obstructs substantially all of the light propagating from the backlight through the aperture 806. For example, as shown in FIG. 9B, both the first shutter 809 and the second shutter 810 are in a closed state. As discussed above, in their individual, respective closed states, each of the first shutter 809 and the second shutter 810 partially obstructs light propagating through the aperture 806. When both the first shutter 809 and the second shutter 810 are in the closed state, the overlapping combination of the shutters obstructs substantially all of the light propagating through the aperture 806.

One feature common in both the fully transmissive state and the fully obstructive state of the two-state mode is that at any given time, both the first shutter 809 and the second shutter 810 are operated in the same open or closed state. For example, in FIG. 9A, which shows a fully transmissive state, both the first shutter 809 and the second shutter 810 are in an open state, and in FIG. 9B, which shows a fully obstructive state, both the first shutter 809 and the second shutter 810 are in a closed state.

FIGS. 9C and 9D show two intermediate states: a first partially transmissive state and a second partially transmissive state, respectively. In addition to the states represented in FIGS. 9A and 9B, the shutter assembly 820 can enter the first and second partially transmissive states shown in FIGS. 9C and 9D when operating in the multi-state mode. Unlike the fully transmissive and fully obstructive states shown in FIGS. 9A and 9B, in which at any given time both the first shutter 809 and the second shutter 810 are in an open state or a closed state, in the two intermediate states shown in FIGS. 9C and 9D, the first shutter 809 and the second shutter 810 are in opposing states.

Turning to FIG. 9C, in the first partially transmissive state, the first shutter 809 is in the closed state while the second shutter 810 is in the open state. As discussed above, in the closed state, the first shutter 809 extends over the aperture by a distance of d1. The extension of the first shutter 809 over the aperture 806 causes a portion 901 of the aperture 806 to be obstructed, while causing a portion 902 of the aperture 806 to be unobstructed. Therefore, in the first partially transmissive state, the shutter assembly 820 allows light propagating from the backlight through the unobstructed portion 902 of the aperture 806 to pass.

In the second partially transmissive state, as shown in FIG. 9D, the first shutter 809 is in the open state while the second shutter 810 is in the closed state. The second shutter 810 extends over the aperture 806 by a distance of d2, causing a portion 903 of the aperture 806 to be obstructed while causing a portion 904 of the aperture 806 to be unobstructed. Therefore, in the second partially transmissive state, the shutter assembly 820 allows light propagating through the partially unobstructed portion 904 of the aperture 806 to pass.

In some implementations, the extent to which the aperture 806 is obstructed in the first partially transmissive state is not equal to that in the second partially transmissive state. In other words, the area of the unobstructed portion 902 in the first partially transmissive state is unequal to the area of the unobstructed portion 904 in the second partially transmissive state. As a result, the amount of light passed by the shutter assembly 820 in the first partially transmissive state is dissimilar to the amount of light passed by the shutter assembly 820 in the second transmissive state. For example, in the first partially transmissive state, the shutter assembly 820 can pass, e.g., 50% of the light passed by a fully unobstructed aperture 806, and in the second partially transmissive state, the shutter assembly 820 can pass, e.g., 25% of the light passed by a fully unobstructed aperture 806. In some other implementations, any arbitrary combination of light passage percentages can be implemented so long as the total of the two is less than 100%.

Thus, having two partially transmissive states with differing light passing capacities allows the shutter assembly 820, in the multi-state mode, to enter into four different states: a fully obstructive state, a first partially transmissive state, a second partially transmissive state, and a fully transmissive state. But, these multiple states are accomplished by two-state operation of each of the individual shutters (the first shutter 809 and the second shutter 810). Furthermore, two-state operation of the respective shutters can be precisely and reliably controlled. Thus, the shutter assembly 820 provides multi-state operation while at the same time retaining the precision and reliability of two-state control of individual shutters.

In some implementations, the individual shutters can be configured to have more than two states. In other words, each shutter can individually be placed in one or more intermediate states in addition to the open and closed states. The individual shutters when placed at separate levels can, in combination, allow the shutter assembly as a whole to operate in even more multiple states.

In some implementations, more than two levels of shutters can be employed to provide additional intermediated states. For example, a third shutter also can be included on a level above the second shutter 810 (as shown in FIG. 8). Similar to the first shutter 809 and the second shutter 810, the third shutter also can be individually controlled. Furthermore, the extent to which the third shutter obstructs the aperture 806 may be different from that of the first shutter 809 and the second shutter 810. Thus, by individually controlling the three shutters, additional intermediate states can be achieved. In some implementations, the third shutter may be configured to move along an axis orthogonal to the axes of motion of the first and second shutters 809 and 810.

FIGS. 10A-10D show various top views of an example shutter assembly 1000 having cross-slot apertures and multi-level shutters. The cross-slot aperture 1006 improves the consistency of contrast ratio over various viewing angles that the shutter assembly 1000 may be viewed by a viewer. This is because the slanted cross-slot aperture 1006 has an averaged contrast ratio that remains fairly consistent over the various viewing angles. This is in contrast to the straight slot aperture (such as aperture 806 shown in FIG. 9A) whose contrast ratio drastically varies with varying viewing angles with which the aperture is viewed, resulting in an inconsistent contrast ratio over various viewing angles.

Figure 10A:
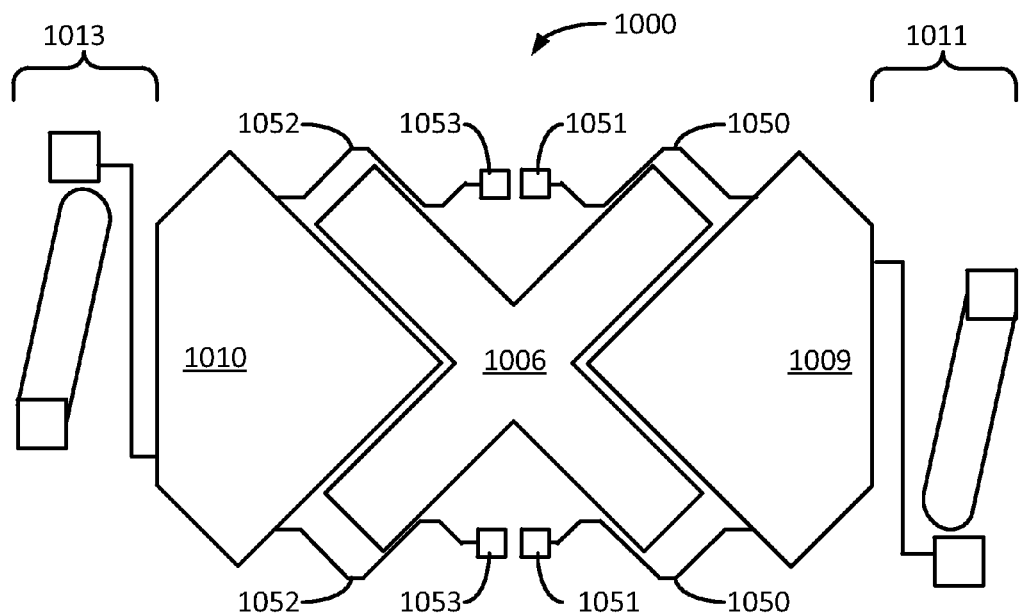
FIGS. 10A-10D show various top views of an example shutter assembly having cross-slot apertures and multi-level shutters.
Figure 10B:
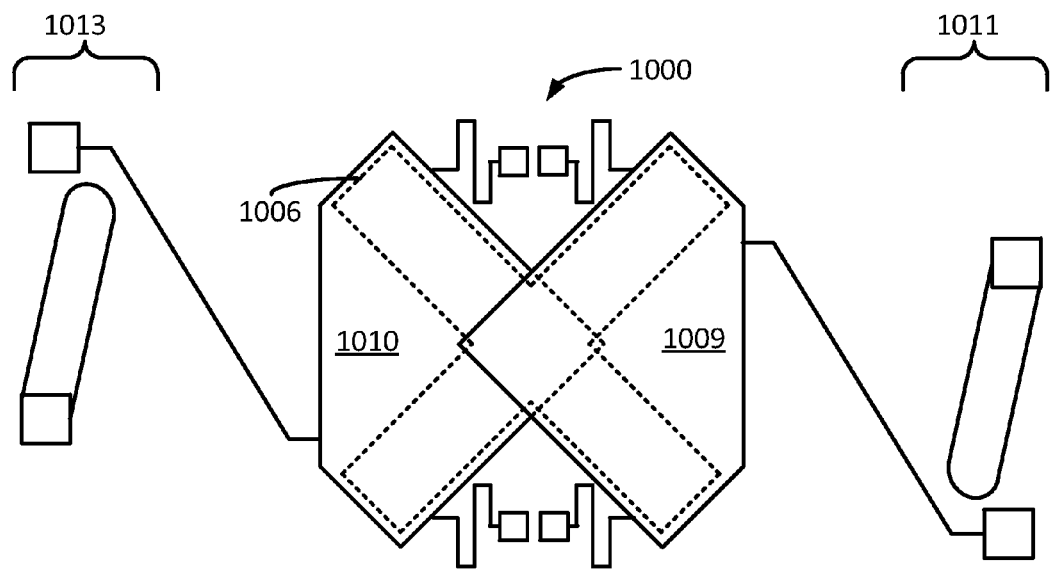
Figure 10C:
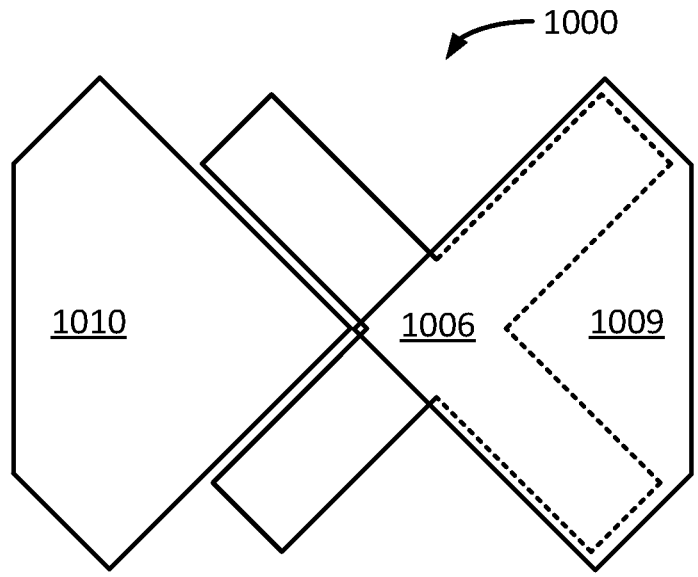
Figure 10D:
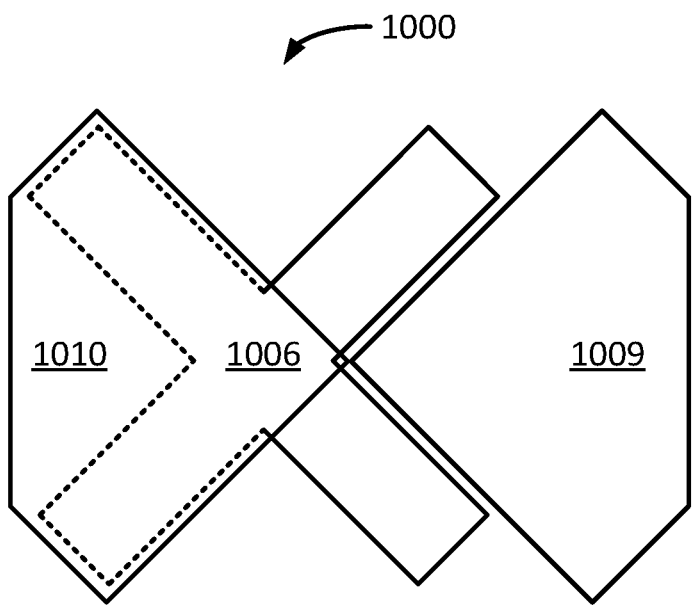

Similar to how FIGS. 9A-9D show the shutter assembly 820 in four different states, FIGS. 10A-10D show the shutter assembly 1000 in various states. For example, FIG. 10A shows the shutter assembly 1000 in a fully transmissive state; FIG. 10B shows the shutter assembly 1000 in a fully obstructive state; while FIGS. 10C and 10D show the shutter assembly 1000 in two different partially transmissive states. Also, similar to the display apparatus 800 shown in FIG. 8 and FIGS. 9A-9D, the shutter assembly 1000 shown in FIGS. 10A-10D can operate in a two-state mode or in a multi-state mode. In the two-state mode, the shutter assembly 1000 can enter either the fully transmissive state (shown in FIG. 10A) or the fully obstructive state (shown in FIG. 10B). In the multi-state mode, the shutter assembly 1000 can additionally enter the two partially transmissive states (shown in FIGS. 10C and 10D).

As mentioned above, FIG. 10A shows the shutter assembly 1000 in the fully transmissive state. The shutter assembly 1000 includes a cross-slot aperture 1006. The cross-slot aperture 1006 improves the viewing angle of the shutter assembly 1000. The shutter assembly 1000 also includes two multi-level shutters: a first cross-slot shutter 1009 and a second cross-slot shutter 1010. Although not clearly seen in FIG. 10A, the first cross-slot shutter 1009 is at a first height from the aperture layer in which the cross-slot aperture 1006 is formed. Similarly, the second cross-slot shutter 1010 is at a second height from the aperture layer such that the second height is less than the first height. Alternatively, as a person having ordinary skill in the art will readily understand, especially in light of the previous Figures and description, the second height can be greater than the first height.

The first cross-slot shutter 1009 is supported by a first actuator 1011 on one side and springs 1050 and spring anchors 1051 on the other side. Similarly, the second cross-slot shutter 1010 is supported by a second actuator 1013 and springs 1052 and anchors 1053. The springs 1050 and 1052 provide restoring forces that counter balance the force exerted on the cross-slot shutters 1009 and 1010 by their respective actuators 1011 and 1013, and return the respective cross-slot shutter shutters 1009 and 1010 to their closed states when their corresponding actuators 1011 and 1013 are de-energized. By actuating the first and the second actuators 1011 and 1013, the first cross-slot shutter 1009 and the second cross-slot shutter 1010 can each be moved separately into an open or closed state.

When the shutter assembly 1000 is in the fully transmissive state in FIG. 10A, both the first cross-slot shutter 1009 and the second cross-slot shutter 1010 are in the open state. As a result, the shutter assembly 1000 allows substantially all of the light propagating from the backlight through the aperture 1006 to pass towards the front of the shutter assembly 1000.

FIG. 10B shows the shutter assembly 1000 in the fully obstructive state. In the fully obstructive state, both the first cross-slot shutter 1009 and the second cross-slot shutter 1010 are in the closed state. As mentioned above, individually in the closed state, each of the first cross-slot shutter 1009 and the second cross-slot shutter 1010 obstructs a portion of the light propagating through the aperture 1006. However, when the first cross-slot shutter 1009 and the second cross-slot shutter 1010 are in the closed state at the same time, the combination substantially obstructs all of the light propagating from the backlight through the aperture 1006. Note that similar to the overlapping shutters 809 and 810 in the fully obstructive state of the display apparatus 800 shown in FIG. 8B, the two shutters 1009 and 1010 of the shutter assembly 1000 also overlap each other. The implementation shown in FIG. 10B has the first cross-slot shutter 1009 at a height that is greater that that of the second cross-slot shutter 1010. The portion of the second cross-slot shutter 1010 that is overlapped by the first cross-slot shutter 1009 is shown in broken lines.

FIGS. 10C and 10D show the shutter assembly 1000 in partially transmissive states. The actuators, springs and anchors associated with each of the two shutters are not shown for clarity of illustration. In the partially transmissive states, only one of the first cross-slot shutter 1009 and the second cross-slot shutter 1010 is in the closed state, while the other is in the open state. For example, in a first partially transmissive state shown in FIG. 10C, the first cross-slot shutter 1009 is in the closed state, while the second cross-slot shutter 1010 is in the open state. In contrast, in a second partially transmissive state shown in FIG. 10D, the first cross-slot shutter 1009 is in the open state, while the second cross-slot shutter 1010 is in the closed state.

In some implementations, the amount of light allowed to pass by the shutter assembly 1000 in the two partially transmissive states can be the same. For example, in the first and second partially transmissive states shown in FIGS. 10C and 10D, the amount of light allowed to pass by the shutter assembly 1000 is substantially the same. In some other implementations, the amount of light allowed to pass by the shutter assembly 1000 in the two partially transmissive states can be different. This can be achieved, for example, by configuring the first cross-slot shutter 1009 and the second cross-slot shutter 1010 such that the extent to which each obstructs the cross-slot aperture 1006 in their respective closed states is different. In some implementations, the sizes and/or the shapes of the first cross-slot shutter 1009 and the second cross-slot shutter 1010 can be made different so that in their respective closed position, they obstruct the cross-slot aperture 1006 to different extents.

Figure 11:
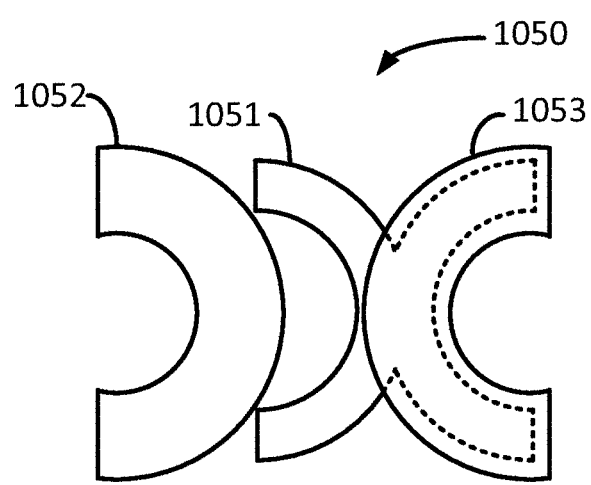
FIG. 11 shows a top view of an example shutter assembly having a curved slot aperture and multi-level shutters.

FIG. 11 shows a top view of an example shutter assembly 1050 having a curved slot aperture 1051 and multi-level shutters. The shutter assembly 1050 includes two curved shutters: a left curved shutter 1052 and a right curved shutter 1053. The right curved shutter is at a height that is greater than the height of the left curved shutter 1052. The shutter assembly 1050 is shown in a first partially transmissive state, in which the left curved shutter is in an open state and the right curved shutter is in a closed state. A person having ordinary skill in the art will readily understand that similar to the shutter assembly 1000 shown in FIGS. 10A-10D, the shutter assembly 1050 also can assume a fully obstructive state, a fully transmissive state and a second partially transmissive state.

FIGS. 12A-12F show cross sectional views of stages of construction of an example shutter assembly 1100 having multi-level shutters. In particular, the stages of construction of the shutter assembly 1100 shown in FIGS. 12A-12F employ a sidewall beam process that is similar to the sidewall beam process described above in constructing the shutter assembly 700 in FIGS. 7A-7D. However, while the stages of construction shown in FIGS. 7A-7D demonstrate how to construct a single level shutter, the stages of construction shown in FIGS. 12A-12F demonstrate how to construct multi-level shutters.

Figure 12A:
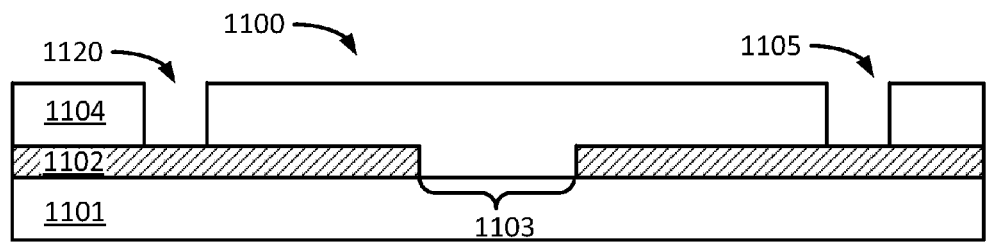
FIGS. 12A-12F show cross sectional views of stages of construction of an example shutter assembly having multi-level shutters.

In FIG. 12A, the construction begins with a transparent substrate 1101 over which an aperture layer 1102 is deposited. The aperture layer 1102 can be similar to the aperture layer 705 described above with respect to FIG. 7A. The aperture layer 1102 is patterned to form an aperture 1103, through which the light output by a backlight can propagate through towards the front of the shutter assembly 1100. After the aperture layer 1102 is patterned to form the aperture 1103, a first sacrificial material 1104 is deposited over the aperture layer 1102, including the aperture 1103. The first sacrificial material 1104 is patterned to form a first anchor hole 1105 and a second anchor hole 1120. In some implementations, a first anchor of a first shutter is constructed in the first anchor hole 1105 while a second anchor for a second shutter is constructed in the second anchor hole 1120. The deposition and patterning of the first sacrificial material 1104 can be similar in concept, and use similar materials and techniques, as those described for the deposition and patterning described in relation to FIGS. 6A-6E and FIGS. 7A-7D.

While not shown, in some implementations, several additional layers, including metal layers and inter-metal dielectric layers are deposited on top of the aperture layer 1102 and are patterned prior to the deposition of the first sacrificial material 1104. These additional layers form or include the controller, or control matrix that will control the shutter assembly when completed. In some other implementations, the additional metal and inter-metal dielectric layers are deposited on the transparent substrate 1101 and patterned prior to deposition of the aperture layer 1102.

Figure 12B:
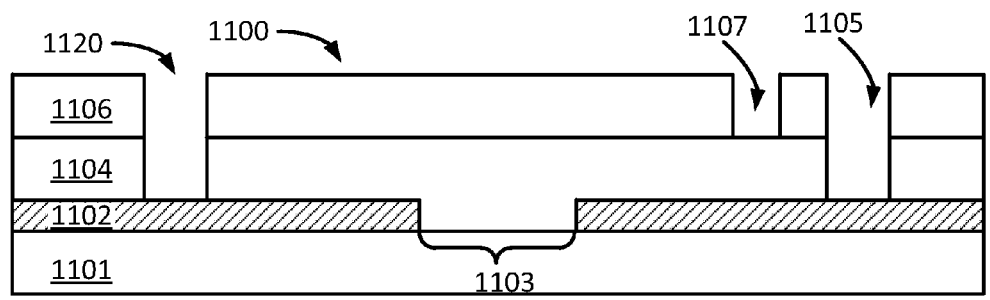

After the first sacrificial material 1104 is patterned, a second sacrificial material 1106 is deposited over the first sacrificial material 1104, as shown in FIG. 12B. The second sacrificial material 1106 will fill the first anchor hole 1105 and the second anchor hole 1120 formed in the first sacrificial layer 1104. The second sacrificial material is then patterned to restore the first anchor hole 1105 and the second anchor hole 1120. In addition, the second sacrificial layer 1106 can be patterned to form sidewalls 1107, against which compliant beams of an actuator of the first shutter will be formed.

Figure 12C:
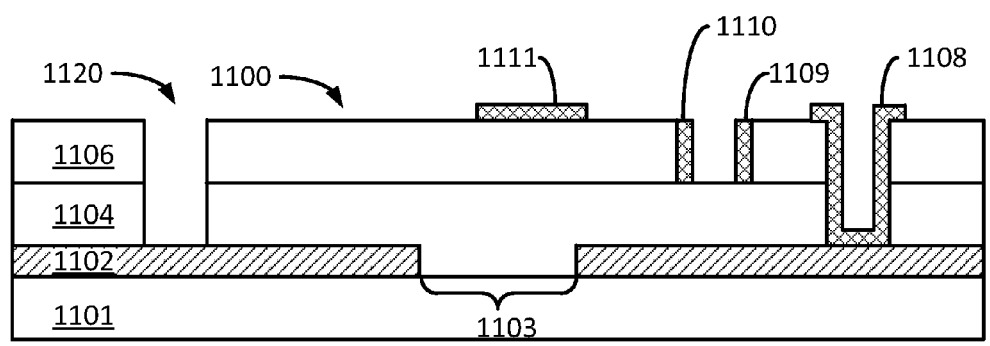

Subsequent to the patterning of the second sacrificial layer 1106, shutter material can be deposited and patterned over the second sacrificial material 1106, as shown in FIG. 12C. The deposition and patterning of the shutter material results in the formation of the first anchor 1108, two first compliant beams 1109 and 1110, and the first shutter 1111. The deposition and patterning of the shutter material can be similar in concept, and uses similar materials and techniques as those described for the deposition and patterning of the shutter material discussed above in relation to FIG. 7C. The combined height of the first sacrificial material 1104 and the second sacrificial material 1106 is appropriately designed to achieve the desired height for the first shutter 1111 from the aperture layer 1102.

Figure 12D:
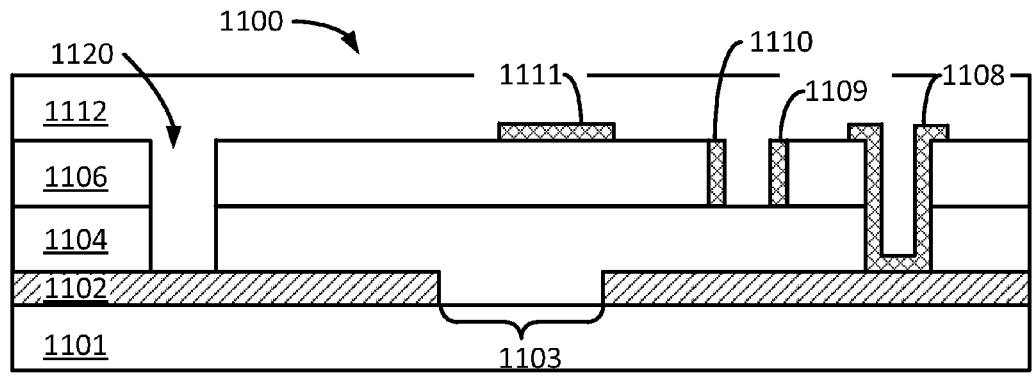

In a single level shutter construction, such as described in relation to FIGS. 7A-7D, the sacrificial materials are removed so that the single level shutter is released. However, as a second shutter is also to be constructed following the construction of the first shutter 1111, the construction of the shutter assembly 1100 continues with the deposition of a third sacrificial material 1112, as shown in FIG. 12D.

Figure 12E:
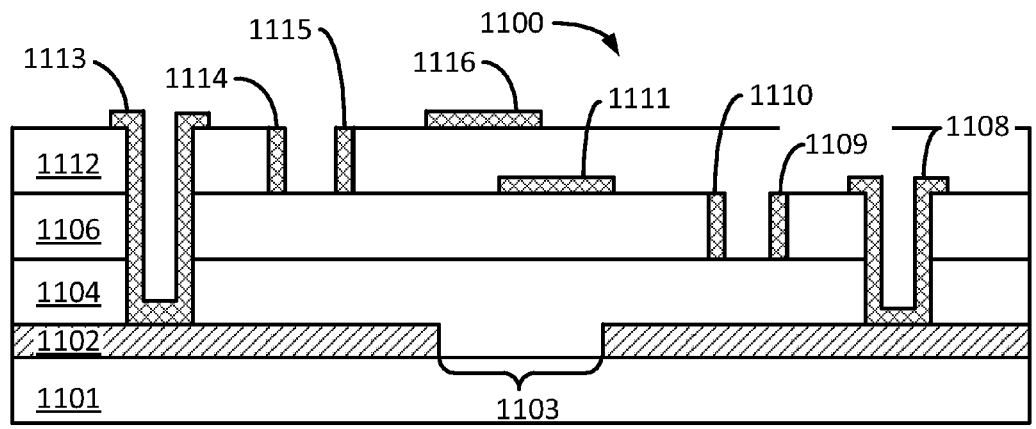

The third sacrificial material 1112 is then patterned to restore the second anchor hole 1120. The patterning also forms sidewalls (not shown) which can be similar to the sidewalls 1107 formed in the second sacrificial layer 1106 and shown above in FIG. 12B. Subsequently, the patterned third sacrificial material 1112 is coated with a shutter material, which is patterned to form the second anchor 1113, the second compliant beams 1114 and 1115, and the second shutter 1116, as shown in FIG. 12E. The deposition and patterning of the second anchor 1113, the second compliant beams 1114 and 1115, and the second shutter 1116 can be similar to the deposition and patterning described above for the first anchor 1108, two first compliant beams 1109 and 1110, and the first shutter 1111 as described in relation to FIG. 12D. The height of the third sacrificial material 1112 is designed such that the combination of the heights of the first 1104, second 1106 and the third 1112 sacrificial materials provide the desired height of the second shutter 1116.

Figure 12F:
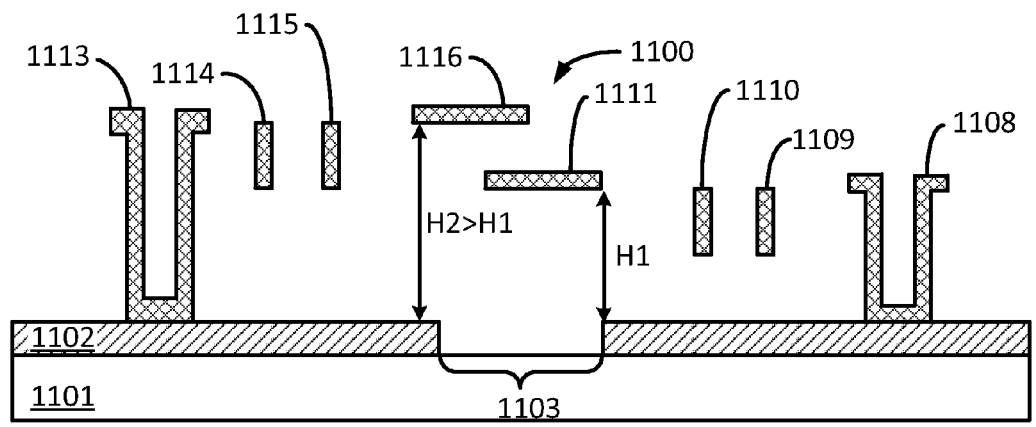

Finally, as shown in FIG. 12F, the first 1104, second 1106 and the third 1112 sacrificial materials are removed so that the first shutter 1111 and the second shutter 1116 are released. The first shutter 1111 is at a height H1 from the aperture layer 1102, while the second shutter 1116 is at a height H2, which is greater than H1, from the aperture layer 1102.

Figure 13:
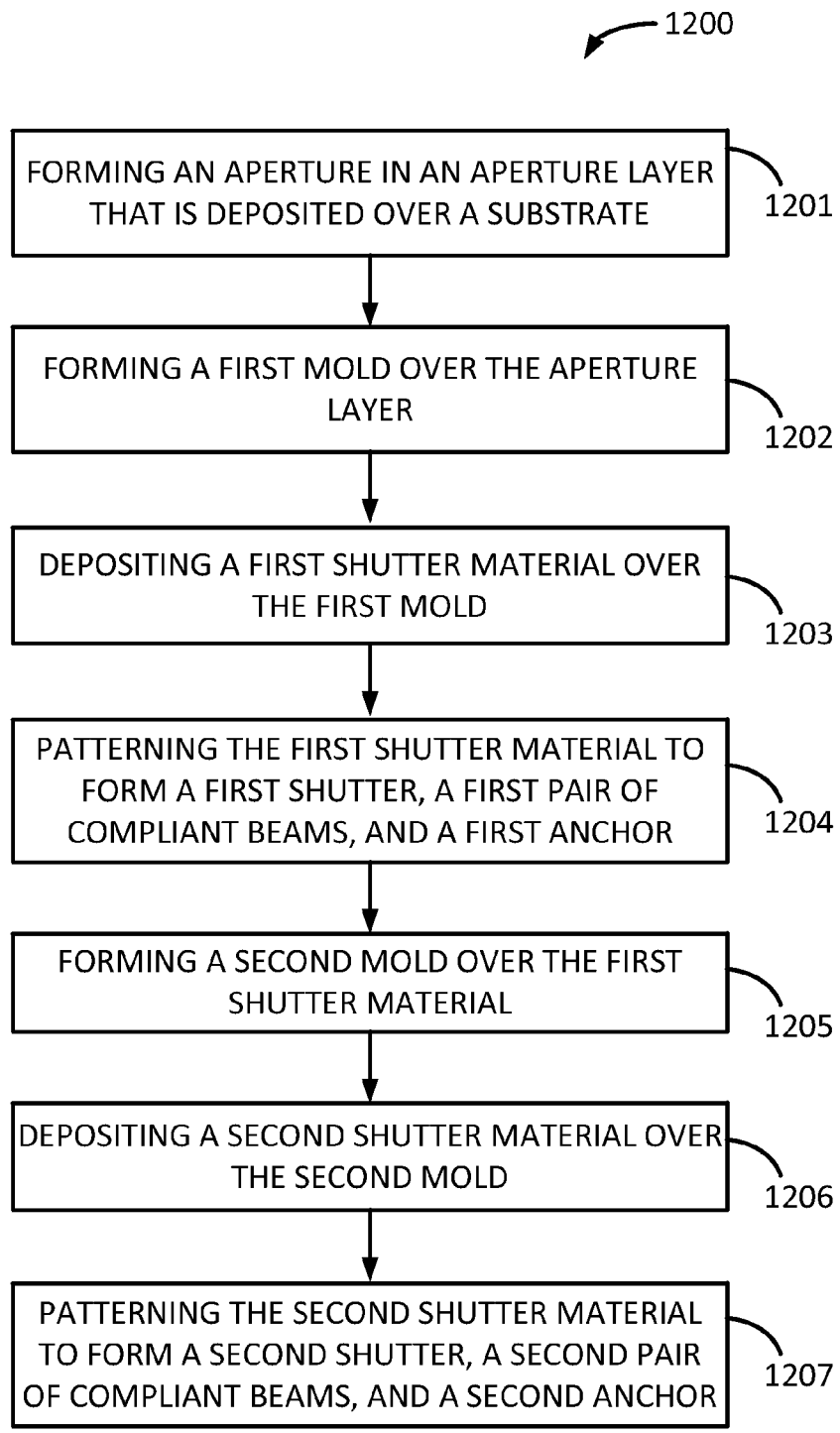
FIG. 13 shows an example flow diagram of a process for fabricating a shutter assembly having multi-level shutters.

FIG. 13 shows an example flow diagram of a process 1200 for fabricating an example shutter assembly having multi-level shutters. The method begins with forming an aperture in an aperture layer that is deposited over a substrate (stage 1201). As described in relation to FIG. 12A, the aperture 1103 is formed in the aperture layer 1102 that is deposited over a transparent substrate 1101.

Subsequently, a first mold is formed over the aperture layer (stage 1202). The formation of the first mold was discussed above in relation to FIG. 12B, in which the first 1104 and the second 1106 sacrificial materials are patterned to form a mold having a first anchor hole 1105, sidewalls 1107 and a second anchor hole 1120. After the formation of the mold, a first shutter material is deposited over the first mold (stage 1203) and is subsequently patterned to form a first shutter, a first pair of compliant beams, and a first anchor (stage 1204). The deposition of the first shutter material was discussed above in relation to FIG. 12C, which also shows the patterning of the first shutter material to form the first shutter 1111, the first pair of compliant beams 1109 and 1110, and a first anchor 1108.

After forming the first shutter, the first pair of compliant beams, and the first anchor, from the first shutter material, a second mold is formed over the first shutter material (stage 1205). The forming of the second mold was discussed above with respect to FIGS. 12D and 12E, in which the third sacrificial material 1112 is deposited over the first shutter 1111, the first pair of compliant beams 1109 and 1110, and a first anchor 1108. The third sacrificial material is then patterned to restore the second anchor hole 1120 and a second pair of sidewalls.

Following the formation of the second mold, a second shutter material is deposited over the second mold (stage 1206). After depositing the second shutter material, the second shutter material is patterned to form a second shutter, a second pair of compliant beams, and a second anchor (stage 1207). The deposition and patterning of the second shutter material was discussed above in relation with FIG. 12E, which shows the formation of the second shutter 1116, the second pair of compliant beams 1114 and 1115, and the second anchor 1113.

Figure 14A:
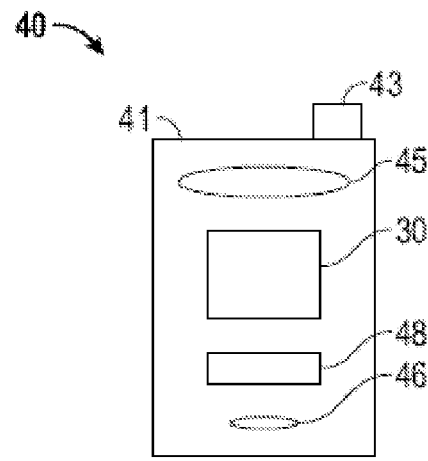
FIGS. 14A and 14B show example system block diagrams illustrating a display device that includes a set of display elements.
Figure 14B:
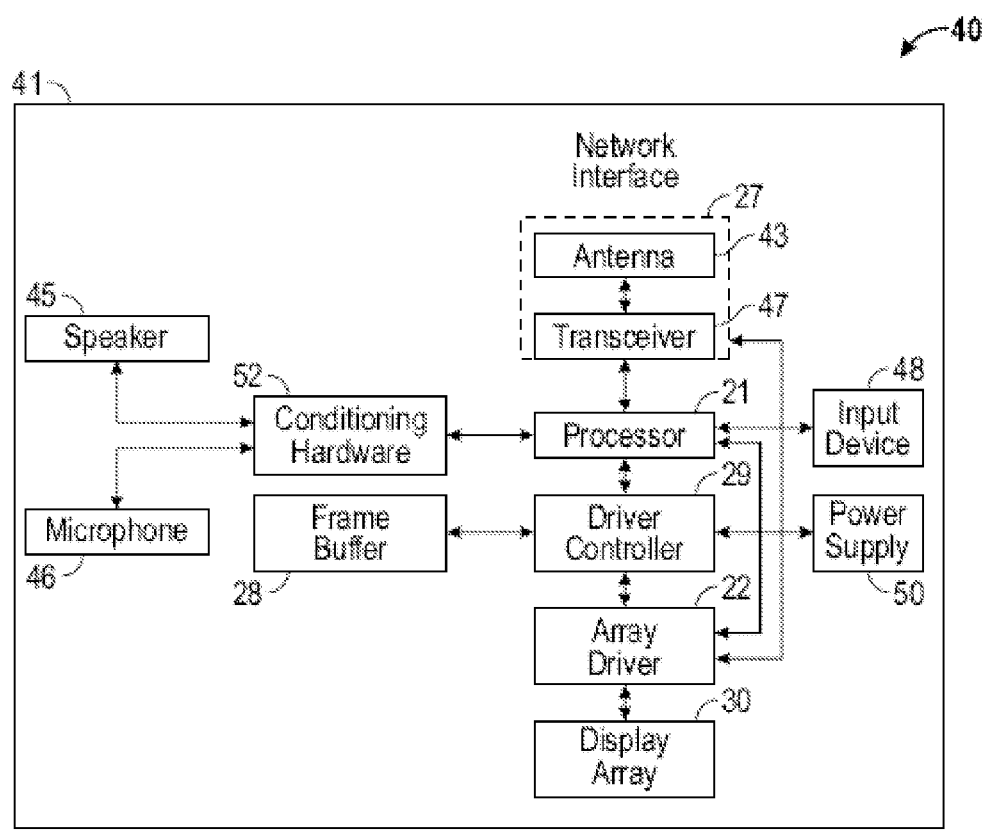

FIGS. 14A and 14B are system block diagrams illustrating a display device 40 that includes a set of display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, electroluminescent (EL) displays, OLED, super twisted nematic (STN) display, LCD, or thin-film transistor (TFT) LCD, or a non-flat-panel display, such as a cathode ray tube (CRT) or other tube device. In addition, the display 30 can include a mechanical light modulator-based display, as described herein.

The components of the display device 40 are schematically illustrated in FIG. 14A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 14A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller. Additionally, the array driver 22 can be a conventional driver or a bi-stable display driver. Moreover, the display array 30 can be a conventional display array or a bi-stable display array. In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

The invention claimed is:

1. An apparatus, comprising:
a light blocking layer, including an aperture for passing light;
a first shutter disposed at a first height over a substrate, the first shutter configured to modulate light propagating through the aperture; and
a second shutter disposed at a second height over the substrate, the second height being unequal to the first height, the second shutter configured to modulate light propagating through the aperture;
wherein the apparatus is configured to operate in at least four states including:
a transmissive state in which the first shutter does not obstruct the aperture and the second shutter does not obstruct the aperture;
a first partially transmissive state in which the first shutter obstructs a first portion of the aperture in a first closed position and the second shutter does not obstruct the aperture;
a second partially transmissive state in which the first shutter does not obstruct the aperture and the second shutter obstructs a second portion the aperture in a second closed position; and
an obstructive state in which the first shutter obstructs the first portion of the aperture and the second shutter obstructs the second portion of the aperture,
wherein the extent to which the first and second shutters cover the aperture in their respective closed positions is different.

2. The apparatus of claim 1, wherein the aperture has a cross slot shape.

3. The apparatus of claim 1, wherein the aperture has a curved slot shape.

4. The apparatus of claim 1, further comprising:
a display;
a processor that is capable of communicating with the display, the processor being capable of processing image data; and
a memory device that is capable of communicating with the processor.

5. The apparatus of claim 1, wherein the area of the first portion of the aperture is in the range of about 25% to about 50% of the total area of the aperture and the area of the second portion of the aperture is in the range of about 60% to about 80% of the total area of the aperture.

6. The apparatus of claim 1, wherein an amount of light allowed to pass through the aperture in the first partially transmissive state is different from an amount of light allowed to pass through the aperture in the second partially transmissive state.

7. The apparatus of claim 4, further comprising:
a driver circuit capable of sending at least one signal to the display; and
a controller capable of sending at least a portion of the image data to the driver circuit.

8. The apparatus of claim 4, further comprising:
an image source module capable of sending the image data to the processor, wherein the image source module comprises at least one of a receiver, transceiver, and transmitter.

9. The apparatus of claim 4, further comprising:
an input device capable of receiving input data and to communicate the input data to the processor.

10. A method for forming a multi-level display device, comprising:
forming an aperture in an aperture layer positioned over a substrate;
forming a first mold over the substrate;
patterning a first shutter material over the first mold to form a first shutter such that, in a first closed position, the first shutter covers a first portion of the aperture;
forming a second mold over the first shutter; and
patterning a second shutter material over the second mold to form a second shutter such that, in a second closed position, the second shutter covers a second portion of the aperture, wherein the extent to which the first and second shutters cover the aperture in their respective closed positions is different.

11. The method of claim 10, further comprising removing the first mold and the second mold after patterning the second shutter material.

12. The method of claim 10, wherein the patterning the first shutter material includes forming a width of the first shutter that is smaller than a width of the aperture; and wherein patterning the second shutter material includes forming a width of the second shutter that is smaller than the width of the aperture.

13. An apparatus, comprising:
light blocking means including an aperture for passing light;
first light modulating means, disposed at a first height over a substrate, for modulating light propagating through the aperture; and
second light modulating means, disposed at a second height over the substrate, the second height being unequal to the first height, for modulating light propagating through the aperture;
wherein the apparatus is configured to operate in at least four states including:
a transmissive state in which the first light modulating means does not obstruct the aperture and the second light modulating means does not obstruct the aperture;
a first partially transmissive state in which the first light modulating means obstructs a first portion of the aperture in a first closed position and the second light modulating means does not obstruct the aperture;
a second partially transmissive state in which the first light modulating means does not obstruct the aperture and the second light modulating means obstructs a second portion the aperture in a second closed position; and
an obstructive state in which the first light modulating means obstructs the first portion of the aperture and the second light modulating means obstructs the second portion of the aperture,
wherein the extent to which the first and second shutters cover the aperture in their respective closed positions is different.

14. The apparatus of claim 13, wherein the first light modulating means is further configured to operate in the first open position when the second shutter is operating in the second open position and to operate in the first closed position when the second shutter is operating in the second closed position.

15. The apparatus of claim 13, wherein the area of the first portion of the aperture is in the range of about 25% to about 50% of the total area of the aperture and the area of the second portion of the aperture is in the range of about 60% to about 80% of the total area of the aperture.

16. The apparatus of claim 13, wherein an amount of light allowed to pass through the aperture in the first partially transmissive state is different from an amount of light allowed to pass through the aperture in the second partially transmissive state.

* * * * *